(12) United States Patent
Kihara et al.

(10) Patent No.: US 9,583,361 B2
(45) Date of Patent: Feb. 28, 2017

(54) METHOD OF PROCESSING TARGET OBJECT AND PLASMA PROCESSING APPARATUS

(71) Applicant: Tokyo Electron Limited, Tokyo (JP)

(72) Inventors: Yoshihide Kihara, Miyagi (JP); Hiromi Mochizuki, Miyagi (JP); Masanobu Honda, Miyagi (JP); Masaya Kawamata, Miyagi (JP); Ken Kobayashi, Miyagi (JP); Ryoichi Yoshida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/427,780

(22) PCT Filed: Sep. 11, 2013

(86) PCT No.: PCT/JP2013/074542
§ 371 (c)(1),
(2) Date: Mar. 12, 2015

(87) PCT Pub. No.: WO2014/042192
PCT Pub. Date: Mar. 20, 2014

(65) Prior Publication Data
US 2015/0243524 A1  Aug. 27, 2015

Related U.S. Application Data

(60) Provisional application No. 61/703,957, filed on Sep. 21, 2012, provisional application No. 61/758,332, filed on Jan. 30, 2013.

(30) Foreign Application Priority Data

Sep. 13, 2012  (JP) .................................. 2012-201825
Jan. 15, 2013  (JP) .................................. 2013-004786

(51) Int. Cl.
*H01L 21/311* (2006.01)
*H01L 21/027* (2006.01)
(Continued)

(52) U.S. Cl.
CPC .. *H01L 21/31144* (2013.01); *H01J 37/32082* (2013.01); *H01J 37/32541* (2013.01);
(Continued)

(58) Field of Classification Search
CPC ......... H01L 21/31144; H01L 21/31116; H01L 21/31138; H01L 21/0273; H01L 21/32136;
(Continued)

(56) References Cited

U.S. PATENT DOCUMENTS 6,482,744 B1 * 11/2002 Wu .................. H01J 37/32009
438/700
6,811,956 B1 * 11/2004 Gabriel ............... H01L 21/0274
257/E21.027

(Continued)

FOREIGN PATENT DOCUMENTS

JP  2006-032908 A  2/2006
JP  2007-189153 A  7/2007
(Continued)

OTHER PUBLICATIONS

International Search Report for PCT/JP2013/074542 dated Nov. 19, 2013.

*Primary Examiner* — Anita Alanko
(74) *Attorney, Agent, or Firm* — Pearne & Gordon LLP

(57) ABSTRACT

A method of processing a target object includes (a) exposing a resist mask to active species of hydrogen generated by exciting plasma of a hydrogen-containing gas within a processing vessel while the target object is mounted on a mounting table provided in the processing vessel; and (b)

(Continued)

etching a hard mask layer by exciting plasma of an etchant gas within the processing vessel after the exposing of the resist mask to the active species of hydrogen. The plasma is excited by applying of a high frequency power for plasma excitation to an upper electrode. In the method, a distance between the upper electrode and the mounting table in the etching of the hard mask layer ((b) process) is set to be larger than a distance between the upper electrode and the mounting table in the exposing of the resist mask to the active species of hydrogen ((a) process).

10 Claims, 23 Drawing Sheets

(51) Int. Cl.
| H01L 21/3213 | (2006.01) |
| H01J 37/32 | (2006.01) |
| H01L 21/3065 | (2006.01) |
| H01L 21/687 | (2006.01) |
| G03F 7/40 | (2006.01) |
| H01L 21/683 | (2006.01) |
| H01L 21/67 | (2006.01) |

(52) U.S. Cl.
CPC .. *H01J 37/32568* (2013.01); *H01J 37/32577* (2013.01); *H01J 37/32733* (2013.01); *H01L 21/0273* (2013.01); *H01L 21/31116* (2013.01); *H01L 21/31138* (2013.01); *H01L 21/32136* (2013.01); *G03F 7/40* (2013.01); *H01L 21/3065* (2013.01); *H01L 21/67109* (2013.01); *H01L 21/6831* (2013.01); *H01L 21/68764* (2013.01)

(58) Field of Classification Search
CPC ........... H01L 21/3065; H01L 21/68764; H01L 21/6831; H01L 21/67109; H01J 37/32082; H01J 37/32541; H01J 37/32577; H01J 37/32568; H01J 37/32733; G03F 7/40

See application file for complete search history.

(56) References Cited

U.S. PATENT DOCUMENTS

| 8,664,122 | B2* | 3/2014 | Hu | H01L 21/0273 |
| | | | | 438/706 |
| 8,828,744 | B2* | 9/2014 | Vegh | H01L 21/31144 |
| | | | | 257/E21.218 |
| 8,877,641 | B2* | 11/2014 | Gabriel | H01L 21/31116 |
| | | | | 216/37 |
| 8,999,184 | B2* | 4/2015 | Kuo | H01L 21/0338 |
| | | | | 216/57 |
| 2007/0218691 | A1* | 9/2007 | Chiba | H01J 37/32091 |
| | | | | 438/689 |
| 2010/0015809 | A1* | 1/2010 | Adams | H01J 37/321 |
| | | | | 438/711 |
| 2011/0049098 | A1* | 3/2011 | Koiwa | H01J 37/32449 |
| | | | | 216/59 |
| 2011/0117749 | A1* | 5/2011 | Sheu | H01J 37/32091 |
| | | | | 438/735 |
| 2011/0220609 | A1 | 9/2011 | Yaegashi | |
| 2011/0250761 | A1* | 10/2011 | Lee | H01J 37/32091 |
| | | | | 438/717 |
| 2011/0303643 | A1 | 12/2011 | Wada | |
| 2014/0193977 | A1* | 7/2014 | Kawamata | H01L 21/3065 |
| | | | | 438/710 |
| 2014/0234992 | A1* | 8/2014 | Kubota | H01L 21/76811 |
| | | | | 438/9 |
| 2015/0170932 | A1* | 6/2015 | Tomura | H01L 21/76802 |
| | | | | 438/723 |

FOREIGN PATENT DOCUMENTS

| JP | 2011-192664 A | 9/2011 |
| JP | 2011-192718 A | 9/2011 |
| JP | 2012-004160 A | 1/2012 |
| JP | 2012-114463 A | 6/2012 |
| WO | 2004/003988 A1 | 1/2004 |

* cited by examiner

FIG. 14
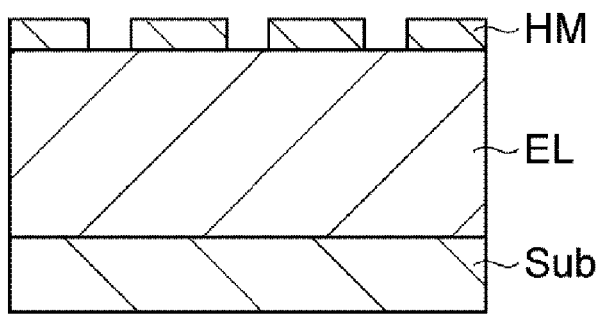
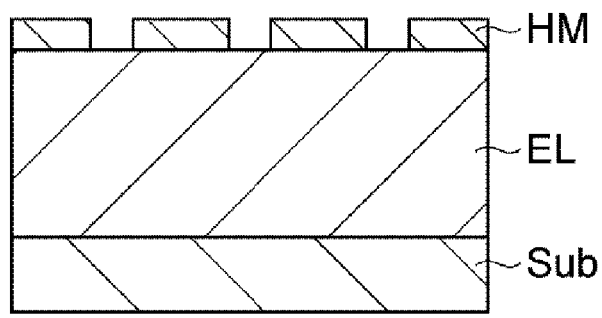

METHOD OF PROCESSING TARGET OBJECT AND PLASMA PROCESSING APPARATUS

CROSS-REFERENCE TO RELATED APPLICATION

This Application is a U.S. national phase application under 35 U.S.C. §371 of PCT Application No. PCT/JP2013/074542 filed on Sep. 11, 2013 which claims the benefit of Japanese Patent Application Nos. 2012-201825 and 2013-004786 filed on Sep. 13, 2012 and Jan. 15, 2013, respectively, and U.S. Provisional Application Ser. Nos. 61/703,957 and 61/758,332 filed on Sep. 21, 2012 and Jan. 30, 2013, respectively, the entire disclosures of which are incorporated herein by reference.

TECHNICAL FIELD

The embodiments described herein pertain generally to a method of processing a target object and a plasma processing apparatus.

BACKGROUND ART

In a manufacturing process of a semiconductor device, an etching target layer is etched by using a mask in order to form a required shape, such as a groove or a hole, on the etching target layer. When etching the etching target layer, a resist mask has been conventionally utilized. Since, however, the resist mask has low resistance against an etchant gas for the etching target layer or plasma of the etchant gas, a pattern of the resist mask may not be maintained until the etching of the etching target layer is completed.

For this reason, there has been employed a method of etching the target layer by using a hard mask which is formed by transcribing the pattern of the resist mask onto a hard mask layer through an etching process. In this method, however, the resist mask is still exposed to an etchant gas for the hard mask layer or plasma of the etchant gas when the hard mask is formed. Thus, the resist mask needs to have resistance against the etchant gas for the hard mask layer or the plasma of the etchant gas. That is, the resist mask is required to have etching resistance.

Conventionally used to improve the etching resistance of the resist mask is a curing process of hardening the resist mask by exposing the resist mask to hydrogen active species before etching the hard mask. Such a curing process is described in Patent Document 1.

Patent Document 1: Japanese Patent Laid-open Publication No. 2007-189153

DISCLOSURE OF THE INVENTION

Problems to be Solved by the Invention

In the manufacture of the semiconductor device, a pattern formed on a target object tends to be miniaturized more and more. Also, it is required to reduce non-uniformity in a dimension of the pattern formed on the entire region of the target object.

For the purposes, it is required to improve a transcription accuracy of a pattern of a resist mask onto a hard mask by increasing a dimensional accuracy of the resist mask.

Means for Solving the Problems

In one example embodiment, there is provided a method of processing a target object. The target object has an etching target layer, a hard mask layer formed on the etching target layer and a resist mask formed on the hard mask layer. The method includes (a) exposing the resist mask to active species of hydrogen generated by exciting plasma of a hydrogen-containing gas within a processing vessel while the target object is mounted on a mounting table provided in the processing vessel; and (b) etching the hard mask layer by exciting plasma of an etchant gas within the processing vessel after the exposing of the resist mask to the active species of hydrogen. The plasma of the hydrogen-containing gas and the plasma of the etchant gas are excited by generating a high frequency electric field between an upper electrode and a lower electrode, which forms the mounting table and is provided to face the upper electrode, through an application of a high frequency power for plasma excitation to the upper electrode. Further, in this method, a distance between the upper electrode and the mounting table in the etching of the hard mask layer ((b) process) is set to be larger than a distance between the upper electrode and the mounting table in the exposing of the resist mask to the active species of hydrogen ((a) process).

In the (a) process of this method, by exposing the resist mask to the active species of hydrogen, the resist mask can be modified, that is, hardened. If the resist mask is exposed to the active species of hydrogen, a side chain of the resist mask is cut, so that the dimensional accuracy of the resist mask, such as a LWR (Line Width Roughness), a LER (Line Edge Roughness) and a SWR (Space Width Roughness) can be improved. Meanwhile, if the resist mask is exposed to the plasma of the hydrogen-containing gas for a long time, a thickness of the resist mask is decreased. The reason for this is because the main chain of a material forming the resist mask is damaged. In the present method, since the (a) process is performed in the state that the distance between the upper electrode and the mounting table is set to be relatively short, the resist mask can be positioned closer to a plasma generation region. As a result, the resist mask can be exposed to a greater amount of the active species of hydrogen, so that a curing process on the resist mask can be performed in a short period of time. Accordingly, in the present method, the thickness of the resist mask maintained upon the completion of the curing process ((a) process) can be increased, and, thus, the resist mask can be maintained for a long time during the etching of the hard mask layer.

Further, in the present method, by setting the distance between the upper electrode and the mounting table to be relatively large, the target object can be processed in a plasma diffusion region. In one example embodiment, to arrange the target object in the plasma diffusion region, the distance between the upper electrode and the mounting table may be set such that a Peclet number on a top surface of the mounting table is equal to or less than 1, for example. In this way, by etching the hard mask layer in the plasma diffusion region, a pattern of the resist mask can be transcribed to the hard mask layer with high accuracy, and, also, non-uniformity in the dimensions of the pattern of the hard mask in the entire region of the target object can be reduced. Further, since the hard mask layer is etched in the plasma diffusion region, the time taken for etching the hard mask layer may be lengthened. Since, however, the processing time of the curing process for the resist mask can be shortened as stated above, the influence of the long etching time of the hard mask layer is reduced.

In the example embodiment, the method of processing the target object may further include (c) etching the etching target layer with a hard mask formed from the hard mask layer after the etching of the hard mask layer. The hard mask may be made of TiN, and plasma of a fluorocarbon-based gas may be generated within the processing vessel in the etching of the etching target layer ((c) process). Further, in the (c) process, a distance between the upper electrode and the mounting table in the etching of the etching target layer ((c) process) may be set to be shorter than the distance between the upper electrode and the mounting table in the etching of the hard mask layer ((b) process).

In the example embodiment, the method may further include (d) applying a negative DC voltage to the upper electrode during the exposing of the resist mask to the active species of hydrogen ((a) process), or between the exposing of the resist mask to the active species of hydrogen ((a) process) and the etching of the hard mask layer ((b) process). In this example embodiment, as positive ions in the processing vessel collide with the upper electrode, secondary electrons are emitted from the upper electrode. As the emitted secondary electrons are irradiated to the resist mask, the resist mask can be further modified. Further, in one example embodiment, the upper electrode may contain silicon. According to this example embodiment, a surface of the resist mask is protected by the silicon emitted from the upper electrode.

In the example embodiment, a negative DC voltage may be applied to the upper electrode during the etching of the etching target layer ((c) process). According to this example embodiment, as the active species of fluorine react with the material forming the upper electrode, the amount of the active species of fluorine within the processing vessel is reduced. Accordingly, an etching rate of the hard mask composed of TiF is also reduced, so that an etching selectivity between the etching target layer and the hard mask can be improved. In one example embodiment, the upper electrode may contain silicon.

In another example embodiment, a plasma processing apparatus includes a processing vessel; a mounting table; an upper electrode; a driving device; a high frequency power supply; a gas supply system; and a controller. The mounting table has a lower electrode and is provided within the processing vessel. The upper electrode is provided to face the lower electrode. The driving device is configured to move the mounting table along a direction in which the upper electrode and the lower electrode are arranged. The high frequency power supply is configured to apply a high frequency power for plasma excitation to the upper electrode. The gas supply system is configured to supply a hydrogen-containing gas and an etchant gas into the processing vessel. The controller is configured to control the driving device and the gas supply system. The controller controls (1) the driving device to set a distance between the upper electrode and the mounting table to a first distance, and controls the gas supply system to supply the hydrogen-containing gas to generate plasma of the hydrogen-containing gas, and subsequently, the controller controls (2) the driving device to set the distance between the upper electrode and the mounting table to a second distance larger than the first distance, and controls the gas supply system to supply the etchant gas to generate plasma of the etchant gas. With this plasma processing apparatus, the resist mask can be processed by performing the above-described (a) process in the state that the distance between the upper electrode and the mounting table is set to be relatively short. Further, the above-described (b) process can be performed in the state that the distance between the upper electrode and the mounting table is set to be relatively large.

In the example embodiment, the gas supply system may be configured to further supply a fluorocarbon-based gas, and the controller may control, after generating the plasma of the etchant gas, the driving device to set the distance between the upper electrode and the mounting table to a distance shorter than the second distance, and control the gas supply system to supply the fluorocarbon-based gas to generate plasma of the fluorocarbon-based gas. With this plasma etching apparatus, the above-described (c) process can be performed.

In the example embodiment, the plasma processing apparatus may further include a DC power supply connected to the upper electrode and configured to generate negative DC voltage. Further, the controller may control the DC power supply to apply the negative DC voltage to the upper electrode during a period while the plasma of the hydrogen-containing gas is being generated, or after the plasma of the hydrogen-containing gas is generated and before the plasma of the etchant gas is generated. Accordingly, the resist mask can be modified by using the secondary electrons emitted from the upper electrode. Further, the controller may control the DC power supply to apply the negative DC voltage to the upper electrode during a period while the plasma of the fluorocarbon-based gas is being generated. Accordingly, the amount of the active species of fluorine can be reduced. Further, the upper electrode may contain silicon. In the configuration where the upper electrode is composed of the silicon, the resist mask can be protected by the silicon emitted from the upper electrode. Furthermore, as the silicon of the upper electrode reacts with the active species of fluorine, the amount of the active species of fluorine within the processing vessel can be reduced.

Effect of the Invention

As stated above, in accordance with the various aspects and embodiments, it is possible to provide a plasma processing apparatus and a processing method of processing a target object, which can further improve a transcription accuracy of a pattern of a resist mask onto a hard mask with a high dimensional accuracy of the resist mask.

BRIEF DESCRIPTION OF THE DRAWINGS

FIG. 14 is a diagram illustrating the target object on which the process S3 is performed.

DETAILED DESCRIPTION

Figure 1:
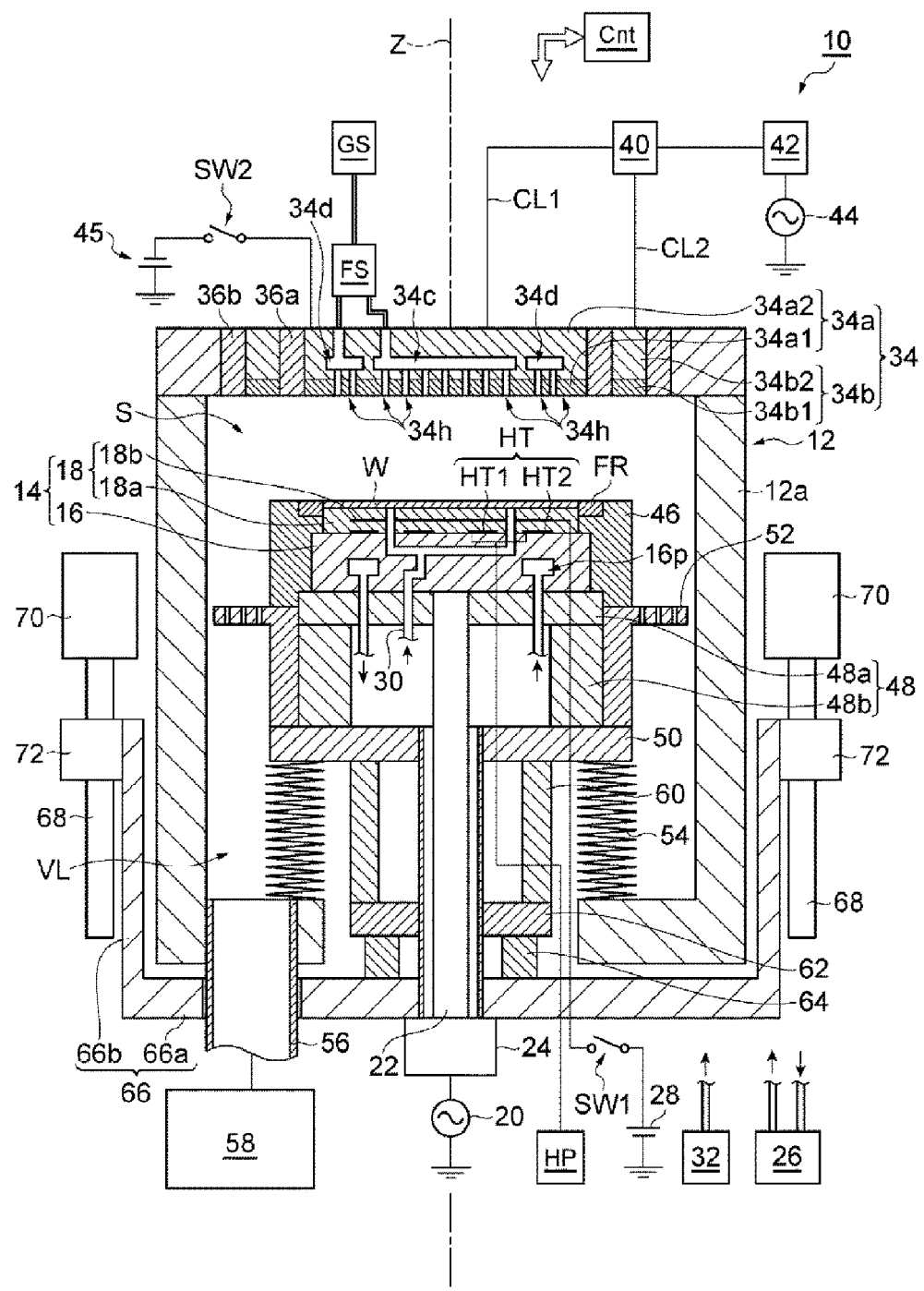
FIG. 1 is a diagram schematically illustrating a plasma processing apparatus in accordance with an example embodiment.

In the following, example embodiments will be described in detail, and reference is made to the accompanying drawings, which form a part of the description. In the drawings, like or corresponding parts will be assigned like reference numerals.

First, a plasma processing apparatus in accordance with an example embodiment will be described. FIG. 1 is a cross sectional view schematically illustrating a plasma processing apparatus in accordance with the example embodiment. The plasma processing apparatus 10 shown in FIG. 1 is configured as a parallel plate type plasma processing apparatus.

The plasma processing apparatus 10 includes a processing vessel 12. The processing vessel 12 has therein a processing space S as an internal space. The processing vessel 12 has a substantially cylindrical sidewall 12a extended in a vertical direction along an axial line Z. A gate valve for opening and closing a loading/unloading opening for a target object (substrate) W is provided at the sidewall 12a.

A mounting table 14 is provided within the processing vessel 12. The mounting table 14 has a base member 16 and an electrostatic chuck 18. The base member 16 has a substantially circular plate shape and has conductivity. The base member 16 serves as a lower electrode and may be made of, but not limited to, aluminum.

A high frequency power supply 20 is connected to the base member 16 via a power feed rod 22 and a matching device 24. The high frequency power supply 20 applies a high frequency power of a preset high frequency (e.g., ranging from 2 MHz to 27 MHz) for ion attraction (i.e., a high frequency bias power) to the lower electrode, i.e., to the base member 16.

The electrostatic chuck 18 is provided on a top surface of the base member 16. The electrostatic chuck 18 is a substantially circular plate-shaped member, and has an insulating layer 18a and a power feed layer 18b. The insulating layer 18a is a film made of an insulator such as ceramic. The power feed layer 18b is a conductive film formed as an inner layer embedded in the insulating layer 18a. The power feed layer 18b is connected with a DC power supply 28 via a switch SW1. If a DC voltage is applied to the power feed layer 18b from the DC power supply 28, a Coulomb force is generated, so that the target object W is attracted to and held on the electrostatic chuck 18.

In the example embodiment, the base member 16 may have a function of cooling the electrostatic chuck 18 by absorbing heat of the electrostatic chuck 18. To elaborate, a coolant path 16p is formed within the base member 16. The coolant path 16p is connected with a coolant inlet line and a coolant outlet line, and the coolant inlet line and the coolant outlet line are connected to a chiller unit 26. A coolant is supplied into the coolant path 16p from the chiller unit 26 through the coolant inlet line and returned back into the chiller unit 26 from the coolant path 16p through the coolant outlet line. In the mounting table 14, by circulating an appropriate coolant such as cooling water through the coolant path 16p, the base member 16 and the electrostatic chuck 18 can be regulated to have a preset temperature.

In the example embodiment, a heater HT as a heating element may be provided between the electrostatic chuck 18 and the base member 16. In the example shown in FIG. 1, the heater HT includes a heater HT1 and a heater HT2. These heaters HT1 and HT2 are connected to a heater power supply HP. The heater HT1 is annularly extended to surround the axial line Z and heats a central region of the electrostatic chuck 18 including a center thereof. As a result, a central region of the target object W including a center thereof is heated. Further, the heater HT2 is provided at the outside of the heater HT1 to be annularly extended and surround the axial line Z. The heater HT2 heats a region of the electrostatic chuck 18 outside the central region thereof, i.e., an edge region of the electrostatic chuck 18 including an edge thereof. As a result, an edge region of the target object W including an edge thereof is heated. By using this heater HT, temperatures of plural regions of the target object W, which are positioned in a radial direction with respect to the center of the target object W, can be controlled individually.

Further, the plasma processing apparatus 10 may further include a gas supply line 30 and a heat transfer gas supply unit 32. The heat transfer gas supply unit 32 is connected with the gas supply line 30. The gas supply line 30 is extended up to the top surface of the electrostatic chuck 18 and is annularly extended on the top surface of the electrostatic chuck 18. The heat transfer gas supply unit 32 is configured to supply a heat transfer gas such as, but not limited to, a He gas into a gap between the top surface of the electrostatic chuck 18 and the target object W.

The plasma processing apparatus 10 further includes an upper electrode 34. The upper electrode 34 is provided above the lower electrode, i.e., the base member 16 in a direction of the axial line Z, facing the lower electrode with the processing space S therebetween. In the example embodiment, the upper electrode 34 may be arranged to close a top opening of the processing vessel 12, as illustrated in FIG. 1.

In the example embodiment, the upper electrode 34 may include an inner electrode portion 34a and an outer electrode portion 34b. The inner electrode portion 34a includes an electrode plate 34a1 and an electrode supporting member 34a2. The electrode plate 34a1 is formed of a conductive member, and, in the example embodiment, the electrode plate 34a1 is made of silicon. The electrode plate 34a1 has a substantially circular plate shape and is provided such that a central axial line of the electrode plate 34a1 coincides with the axial line Z. The electrode supporting member 34a2 has conductivity and is made of, but not limited to, aluminum. The electrode supporting member 34a2 is configured to support the electrode plate 34a1.

The outer electrode portion 34b includes an electrode plate 34b1 and an electrode supporting member 34b2. The electrode plate 34b1 is a conductive member, and, in the example embodiment, the electrode plate 34b1 is made of silicon. The electrode plate 34b1 is provided at the outside of the electrode plate 34a1 to be annularly extended about the axial line Z. The electrode supporting member 34b2 has conductivity and is made of, but not limited to, aluminum. The electrode supporting member 34b2 is provided at the outside of the electrode support 34a2 to be annularly extended about the axial line Z, and the electrode supporting member 34b2 is configured to support the electrode plate 34b1. An insulating member 36a is provided between the outer electrode portion 34b and the inner electrode portion 34a, and another insulating member 36b is provided between the outer electrode portion 34b and an upper portion of the processing vessel 12.

In the example embodiment, the inner electrode portion 34a and the outer electrode portion 34b may be connected to a power control circuit 40 via a line CL1 and a line CL2, respectively. The power control circuit 40 is connected with a high frequency power supply 44 via a matching device 42. The high frequency power supply 44 is configured to supply a high frequency power of a preset high frequency (e.g., 27 MHz or higher) for plasma generation to the upper electrode 34.

Figure 2:
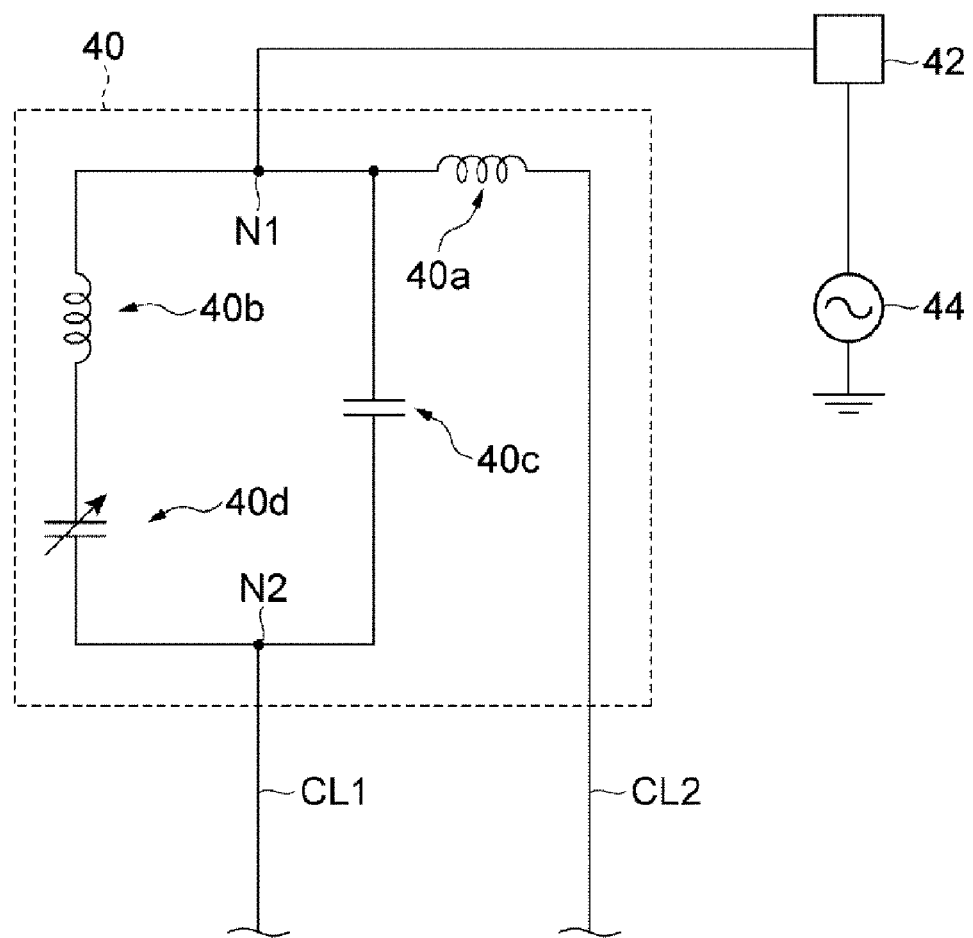
FIG. 2 is a diagram illustrating an example power control circuit 40 shown in FIG. 1.

FIG. 2 is a diagram illustrating an example of the power control circuit 40 shown in FIG. 1. As depicted in FIG. 2, the power control circuit 40 may include inductors 40a and 40b and capacitors 40c and 40d. A line extended from the matching device 42 to the power control circuit 40 is connected to the power control circuit 40 at a node N1. One end of the inductor 40a is connected to the node N1, and the other end of the inductor 40a is connected with a line CL2. Further, one end of the capacitor 40c is also connected to the node N1 in parallel with the inductor 40a, and one end of a series circuit of the inductor 40b and the variable capacitor 40d is further connected to the node N1. The other end of the capacitor 40c and the other end of the series circuit of the inductor 40b and the variable capacitor 40d are connected to a node N2, and a line CL1 is connected to the node N2.

With this power control circuit 40, by adjusting a capacitance of the variable capacitor 40d, power levels of high frequency powers supplied from the high frequency power supply 44 to the inner electrode portion 34a and the outer electrode portion 34b can be respectively controlled. Accordingly, a plasma density under the inner electrode portion 34a and a plasma density under the outer electrode portion 34b can be controlled relative to each other. As a result, a processing rate at the central region of the target object W and a processing rate at the edge region of the target object W can also be controlled relative to each other.

Referring back to FIG. 1, in the example embodiment, a DC power supply 45 is connected to the inner electrode portion 34a via a switch SW2. The DC power supply 45 is configured to apply a negative DC voltage to the inner electrode portion 34a while the switch SW2 is closed.

Further, in the plasma processing apparatus 10, the upper electrode 34 serves as a shower head. In the example embodiment, the electrode supporting member 34a2 of the inner electrode portion 34a has a first buffer room 34c and a second buffer room 34d. The first buffer room 34c is formed in a central portion of the electrode supporting member 34a2, and the second buffer room 34d is annularly formed to surround the first buffer room 34c while being separated from the first buffer room 34c. The first buffer room 34c and the second buffer room 34d are connected with the gas supply unit GS via a flow splitter FS. Further, a multiple number of gas discharge holes 34h communicating with the processing space S are extended downwards from the first buffer room 34c and the second buffer room 34d through the electrode supporting member 34a2 and the electrode plate 34a1.

Figure 3:
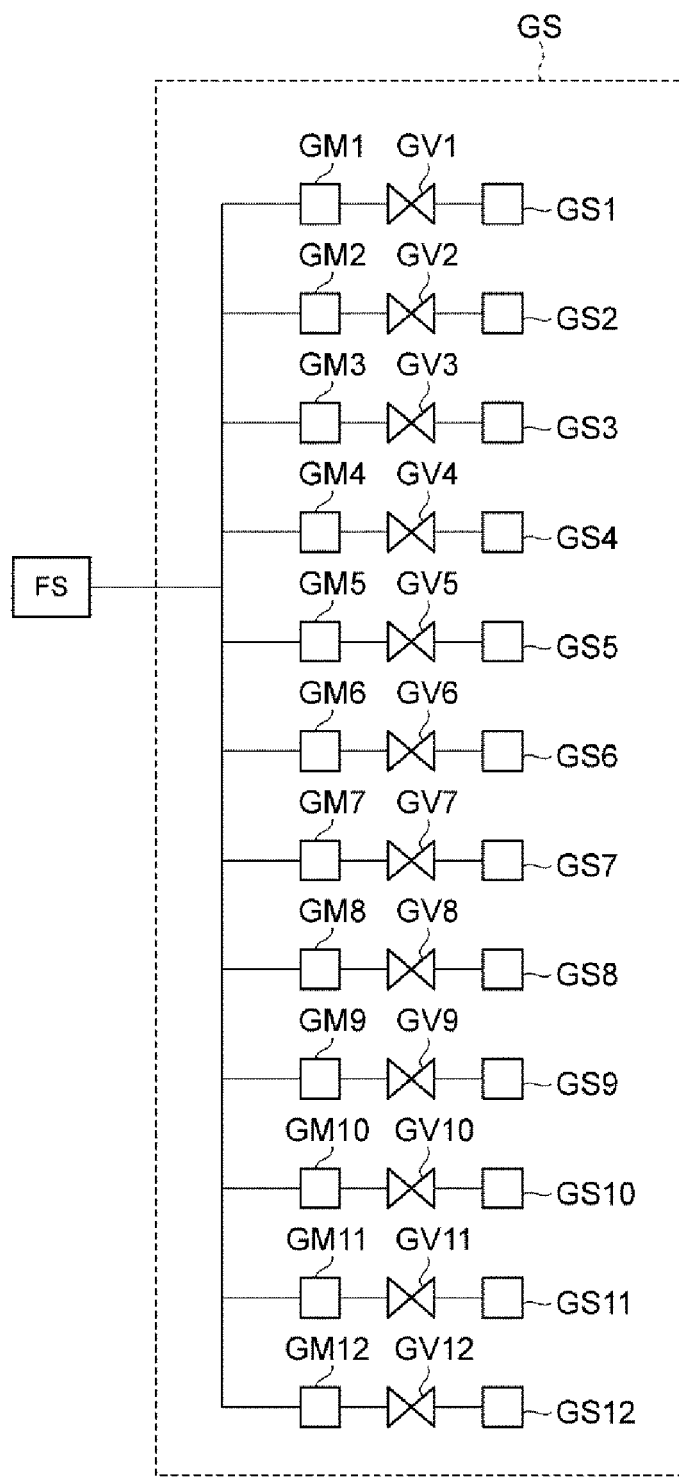
FIG. 3 is a diagram illustrating a gas supply unit GS shown in FIG. 1.

FIG. 3 is a diagram illustrating an example of the gas supply unit GS shown in FIG. 1. The gas supply unit GS shown in FIG. 3 may include gas sources GS1 to GS12, valves GV1 to GV12, and mass flow controllers GM1 to GM12. The gas sources GS1 to GS12 are sources of a $H_2$ gas, a $N_2$ gas, a $CF_4$ gas, a $CHF_3$ gas, an $O_2$ gas, a HBr gas, a He gas, a $Cl_2$ gas, a $C_4F_8$ gas, an Ar gas, a $CH_4$ gas and a $CH_2F_2$ gas, respectively. The gas sources GS1 to GS12 are connected with the flow splitter FS via the valves GV1 to GV12 and the mass flow controllers GM1 to GM12, respectively.

In the plasma processing apparatus 10, the gas supply unit GS, the flow splitter FS, the first and second buffer rooms 34c and 34d and the multiple number of gas discharge holes 34h constitute a gas supply system. With this gas supply system, a gas selected from the gases of the gas sources GS1 to GS12 is supplied to the flow splitter FS while a flow rate thereof is controlled by a corresponding mass flow controller. The gas sent to the flow splitter FS is supplied into the first and second buffer rooms 34c and 34d at a preset split ratio by the flow splitter FS, and then, discharged into the processing space S through the multiple number of gas discharge holes 34h. The gas discharge holes 34h extended from the first buffer room 34c are arranged to face the central region of the target object W, and the gas discharge holes 34h extended from the second buffer room 34d are arranged to face the edge region of the target object W. Accordingly, in the plasma processing apparatus 10, a flow rate of the gas supplied to a space above the central region of the target object W and a flow rate of the gas supplied to a space above the edge region of the target object W can be controlled individually. Therefore, it is possible to control the processing rate at the central region of the target object W and the processing rate at the edge region of the target object W individually.

Further, the plasma processing apparatus 10 includes a driving device configured to adjust a distance between the upper electrode 34 and the mounting table 14 including the lower electrode. In the example embodiment shown in FIG. 1, the plasma processing apparatus 10 has the driving device capable of moving the mounting table 14 in the direction of the axial line Z, i.e., in the vertical direction. To elaborate, the plasma processing apparatus 10 includes a cylindrical surrounding member 46 that surrounds the mounting table 14. A focus ring FR is provided on a top surface of the cylindrical surrounding member 46 to surround the electrostatic chuck 18.

The cylindrical surrounding member 46 and the base member 16 are supported on a supporting table 48. The supporting table 48 includes a plate member 48a and a cylindrical leg member 48b. A lower end of the cylindrical surrounding member 46 and a bottom surface of the base member 16 are in contact with the plate member 48a of the supporting table 48, and the cylindrical surrounding member 46 and the base member 16 are fastened to the plate member 48a. The leg member 48b is extended downwards from a bottom surface of the plate member 48a. The supporting table 48 is provided on a supporting plate 50 such that a lower end of the leg member 48b is in contact with a top surface of the supporting plate 50. The supporting table 48 is fixed to the supporting plate 50.

A baffle plate 52 is provided between the supporting plate 50 and the cylindrical surrounding member 46. The baffle plate 52 is annularly extended between the supporting table 48 and the sidewall 12a of the processing vessel 12. The baffle plate 52 has a multiple number of through holes. Further, a cylindrical bellows 54 is provided between a periphery portion of a bottom surface of the supporting plate 50 and a lower portion of the processing vessel 12. A gas exhaust path VL, which communicates with the processing space S with the baffle plate 52 therebetween, is formed by the bellows 54 and the sidewall 12a of the processing vessel 12. Spaces within the processing vessel 12 such as the gas exhaust path VL and the processing space S are isolated from the outside of the processing vessel 2. A gas exhaust pipe 56 communicating with the gas exhaust path VL is fastened to the lower portion of the processing vessel 12, and a gas exhaust device 58 is connected to the gas exhaust pipe 56.

A leg member 60, an annular plate 62 and a leg member 64 are provided within a space enclosed by the bellows 54. An upper end of the leg member 60 is coupled to a bottom surface of the supporting plate 50, and a lower end of the leg member 60 is fastened to a top surface of the annular plate 62. An upper end of the leg member 64 is fastened to a bottom surface of the annular plate 62, and a lower end of the leg member 64 is fixed to a plate member 66a of a link 66.

As shown in FIG. 1, the link 66 includes the plate member 66a and two column-shaped members 66b. The plate member 66a is provided under the lower portion of the processing vessel 12. In the example embodiment, the aforementioned matching device 24 is fastened to the plate member 66a. Further, through holes extended in the direction of the axial line Z are formed in centers of the plate member 66a, the supporting plate 50 and the plate member 48a of the supporting member 48. The aforementioned power feed rod 22 is extended up to the base member 16 through the through hole of the plate member 66a, an inner hole of the annular plate 62, the through hole of the supporting plate 50 and the through hole of the plate member 48a of the supporting member 48.

The column-shaped members 66b are extended upwards from a periphery of the plate member 66a. Further, each column-shaped member 66b is extended substantially in parallel with the sidewall 12a at the outside of the sidewall 12a. A moving device using a ball screw is connected to each column-shaped member 66a. To elaborate, two screw shafts 68 are extended substantially in parallel with the two column-shaped members 66b at the outside of the sidewall 12a, respectively, and the screw shafts 68 are respectively connected to two motors 70. Further, two nuts 72 are respectively fastened to the two screw shafts 68, and the two column-shaped members 66b are respectively fastened to the nuts 72.

With this moving device, by rotating the motors 70, the nuts 72 are moved in the direction of the axial line Z, i.e., moved up and down. Along with this vertical movement of the nuts 72, the mounting table 14, which is indirectly supported on the link 66, can also be moved in the direction of the axial line Z, i.e., can be moved up and down. As the mounting table 14 is moved up and down, the bellows 54 is expanded and contracted. Accordingly, the distance between the upper electrode 34 and the base member 16 (i.e., the lower electrode) can be adjusted while achieving airtightness of the processing space S.

Further, in the example embodiment, the plasma processing apparatus 10 further includes a controller Cnt. The controller Cnt may be implemented by, but not limited to, a programmable computer. The controller Cnt is connected to the switch SW1, the high frequency power supply 20, the matching device 24, the high frequency power supply 44, the matching device 42, the variable capacitors 40d, the switch SW2, the gas supply unit GS, the flow splitter FS, the heat transfer gas supply unit 32, the chiller unit 26, the heater power supply HP, the gas exhaust device 58 and the motors 70.

The controller Cnt is operated according to a program based on an inputted recipe and outputs control signals. Opening/closing of the switch SW1, power supply from the high frequency power supply 20, an impedance of the matching device 24, power supply from the high frequency power supply 44, an impedance of the matching device 42, a capacitance of the variable capacitor 40d, opening/closing of the switch SW1, selection of a gas to be supplied from the gas supply unit GS and a flow rate of the selected gas, a split ratio of the flow splitter FS, gas supply from the heat transfer gas unit 32, a coolant flow rate and a coolant temperature of the chiller unit 26, power supply from the heater power supply HP, gas exhaust by the gas exhaust device 58, and operations of the motors 70 can be controlled in response to the control signals from the controller Cnt.

Figure 4:
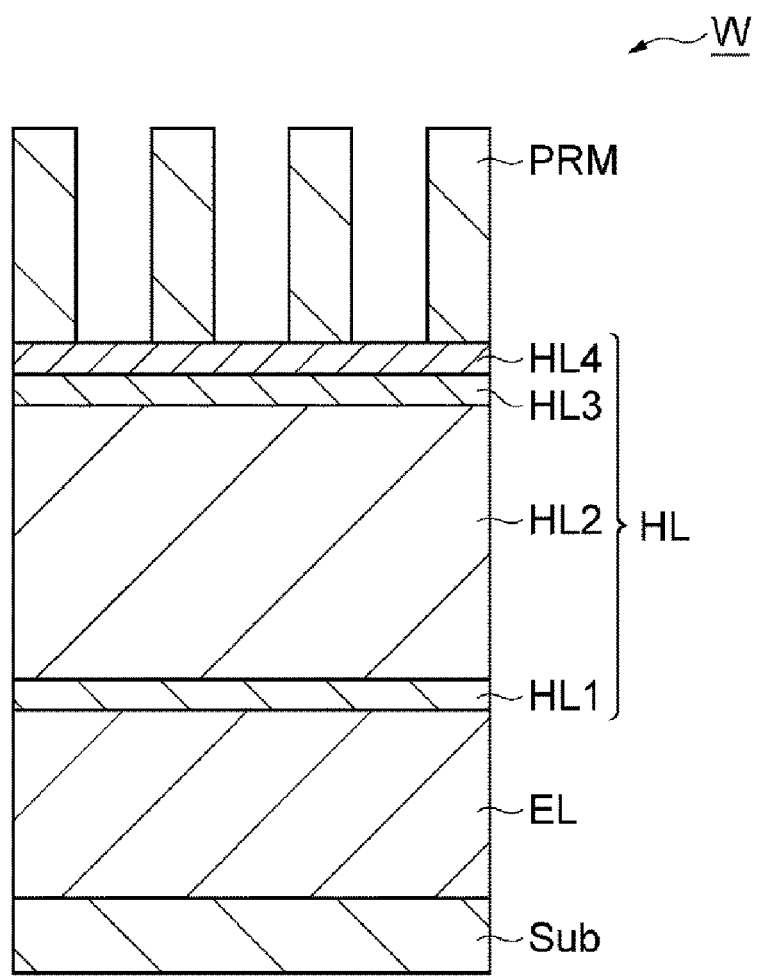
FIG. 4 is a cross sectional view illustrating an example target object to be processed.

Below, a target object W that can be processed by the plasma processing apparatus 10 will be explained. FIG. 4 is a cross sectional view illustrating an example target object to be processed. The target object W shown in FIG. 4 includes a substrate Sub, an etching target layer EL, a hard mask layer HL and a resist mask PRM. The substrate Sub is, for example, a Si substrate. The etching target layer EL is formed on a main surface of the substrate Sub. The etching target layer EL may be made of, by way of non-limiting example, methanosilicate or SiN.

The hard mask layer HL is formed on the etching target layer EL. In the example embodiment, the hard mask layer HL may include first to fourth layers HL1 to HL4 deposited on the etching target layer EL in sequence. The first to fourth layers HL1 to HL4 are a TiN layer, a SOH (Spin On Hard mask) layer, a SiON layer, an antireflection film (BARC), respectively. The resist mask PRM is formed on the hard mask layer HL and has a preset pattern. The resist mask PRM is prepared by performing exposure and development on an ArF resist.

Figure 5:
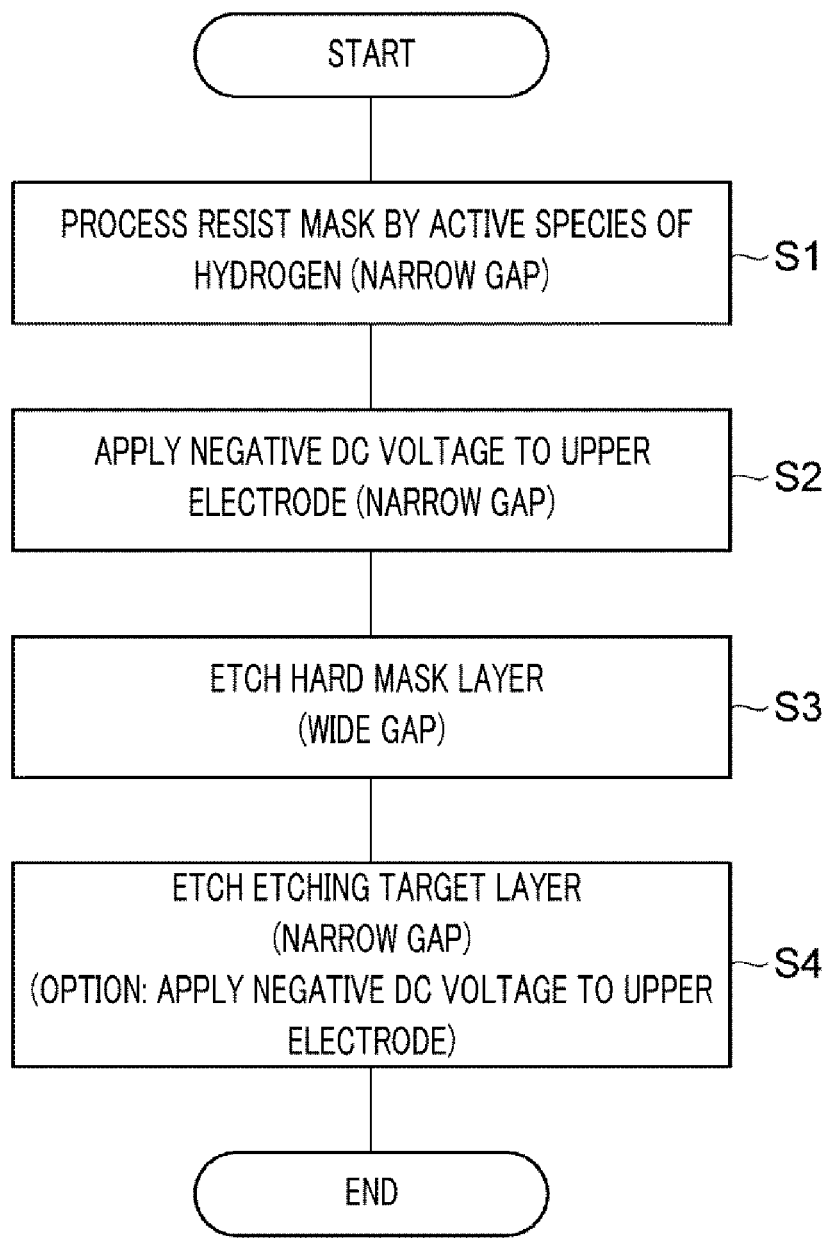
FIG. 5 is a flowchart for describing a method of processing a target object in accordance with the example embodiment.

Below, an operation of the plasma processing apparatus 10 at the time of processing the target object W and a target object processing method in accordance with the example embodiment will be described. FIG. 5 is a flowchart for describing the target object processing method in accordance with the example embodiment.

As depicted in FIG. 5, in the target object processing method, a process S1 of exposing the target object W shown in FIG. 4 to active species of hydrogen is first performed. In the process S1, with the target object W shown in FIG. 4 mounted on the mounting table 14, the distance between the upper electrode 34 and the mounting table 14 is set to a relatively small first distance. The first distance is equal to or less than 50 mm, e.g., 35 mm. In this process S1, plasma of a hydrogen-containing gas is excited within the processing vessel 12.

Figure 6:
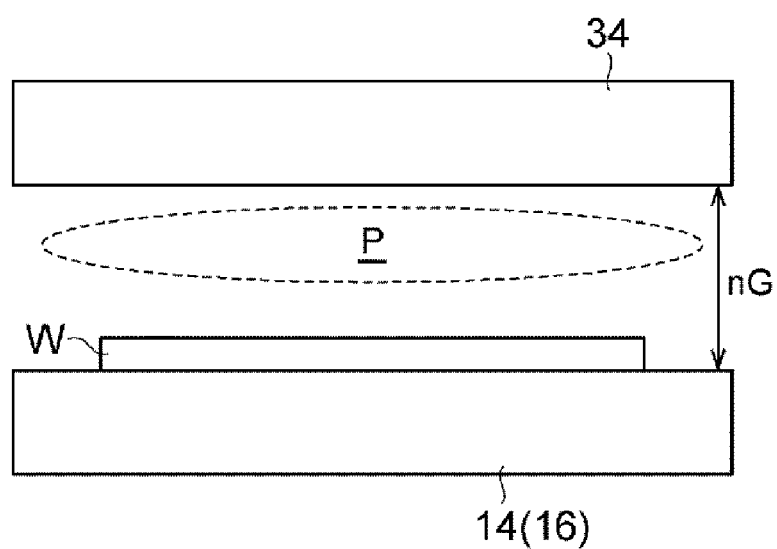
FIG. 6 is a diagram illustrating a state within a processing vessel in a process S1.

To perform the process S1 in the plasma processing apparatus 10, the motors 70 are driven in response to a control signal from the controller Cnt, and the distance between the upper electrode 34 and the mounting table 14 is set to a first distance nG, as illustrated in FIG. 6. Further, in response to a control signal from the controller Cnt, a $H_2$ gas is supplied from the gas source GS1 into the processing vessel 12, and a high frequency power is supplied to the upper electrode 34. Accordingly, plasma P of the $H_2$ gas is excited within the processing vessel 12. Further, in the process S1, a $N_2$ gas may also be supplied from the gas source GS2 in addition to the $H_2$ gas.

Figure 7:
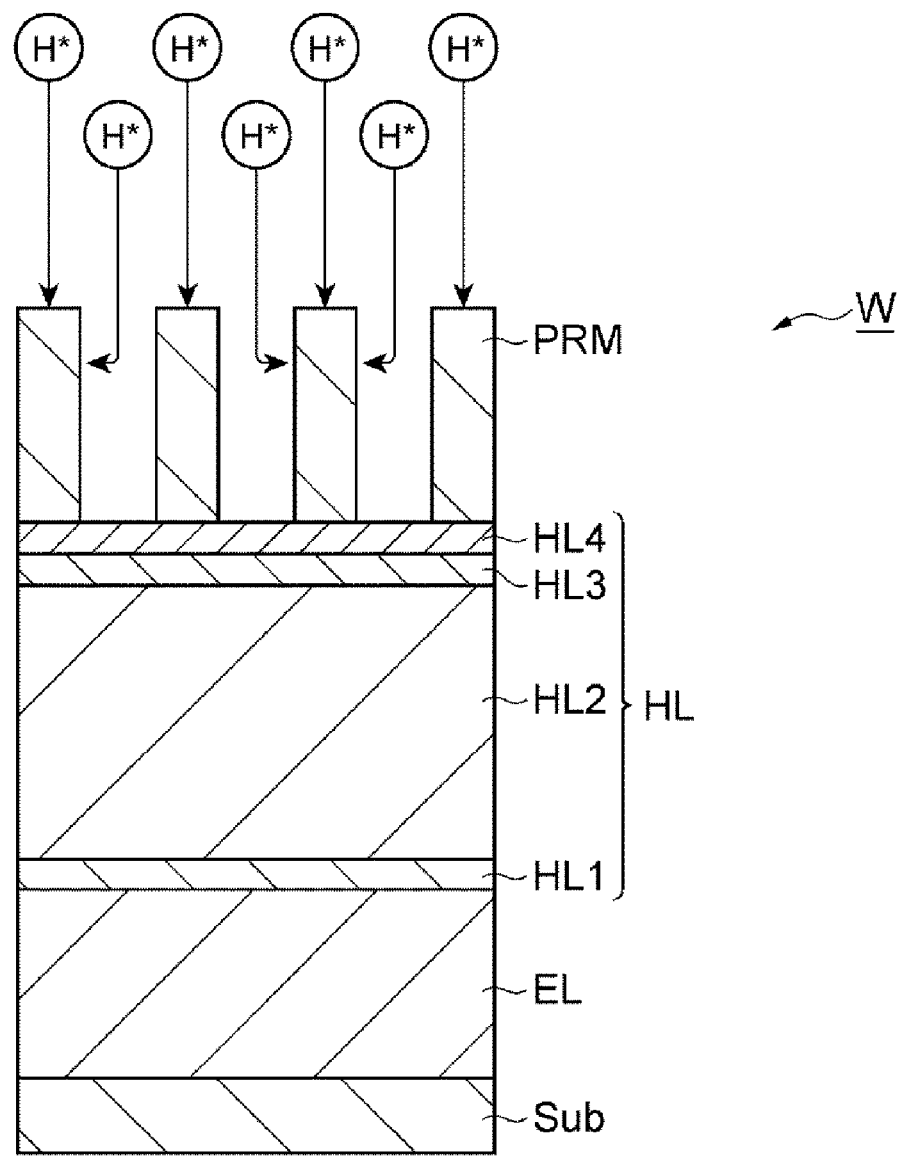
FIG. 7 is a diagram for describing the process S1.

In the process S1, by exciting the plasma of the hydrogen-containing gas, active species of hydrogen such as hydrogen radicals are generated in the processing vessel 12. As depicted in FIG. 7, if the resist mask PRM is exposed to the active species of hydrogen, the resist mask PRM is hardened. Further, if the resist mask PRM is exposed to the active species of hydrogen, a side chain of the resist mask PRM may be cut from a main chain thereof. As a result, the dimensional accuracy of the resist mask PRM can be improved. To be specific, a LWR (Line Width Roughness), a LER (Line Edge Roughness) and a SWR (Space Width Roughness) of the resist mask PRM are decreased.

Further, in the process S1, the target object W is exposed to the active species of hydrogen at a position close to a plasma generation region, as shown in FIG. 6. That is, in the process S1, the position of the target object W is set to allow the resist mask PRM to be exposed to a greater amount of the active species of hydrogen in a short period of time. Accordingly, a processing time of the process S1 taken before the LWR, LER and SWR of the resist mask PRM reach required values can be shortened. As stated, in the present method, since the processing time of the process S1 can be shortened, a thickness of the resist mask PRM maintained upon the completion of the process S1 can be increased. This reason may be as follows. That is, if the processing time of the process S1 is lengthened, a damage on the main chain of the resist mask PRM is generally generated. However, in the present method, the damage on the main chain of the resist mask PRM can be reduced by shortening the processing time of the process S1.

Subsequently, in the present method, a process S2 of applying a negative DC voltage to the upper electrode 34 is performed, as shown in FIG. 5. In the process S2, the distance between the mounting table 14 and the upper electrode 34 is maintained at the first distance nG. In case of performing the process S2 in the plasma processing apparatus 10, the switch SW2 is closed in response to a control signal from the controller Cnt in the state that the target object W is mounted on the mounting table 14. Accordingly, a negative DC voltage generated by the DC power supply 45 is applied to the inner electrode portion 34a. Further, in the process S2, a He gas is supplied into the processing vessel 12 from the gas source GS7 and a high frequency power is applied to the upper electrode 34 in response to control signals from the controller Cnt. In addition, in the process S2, another rare gas such as an Ar gas from the gas source GS10 may be supplied instead of the He gas. Further, in the process S2, a $H_2$ gas from the gas source GS1 may also be supplied together with the He gas or the Ar gas.

Figure 8:
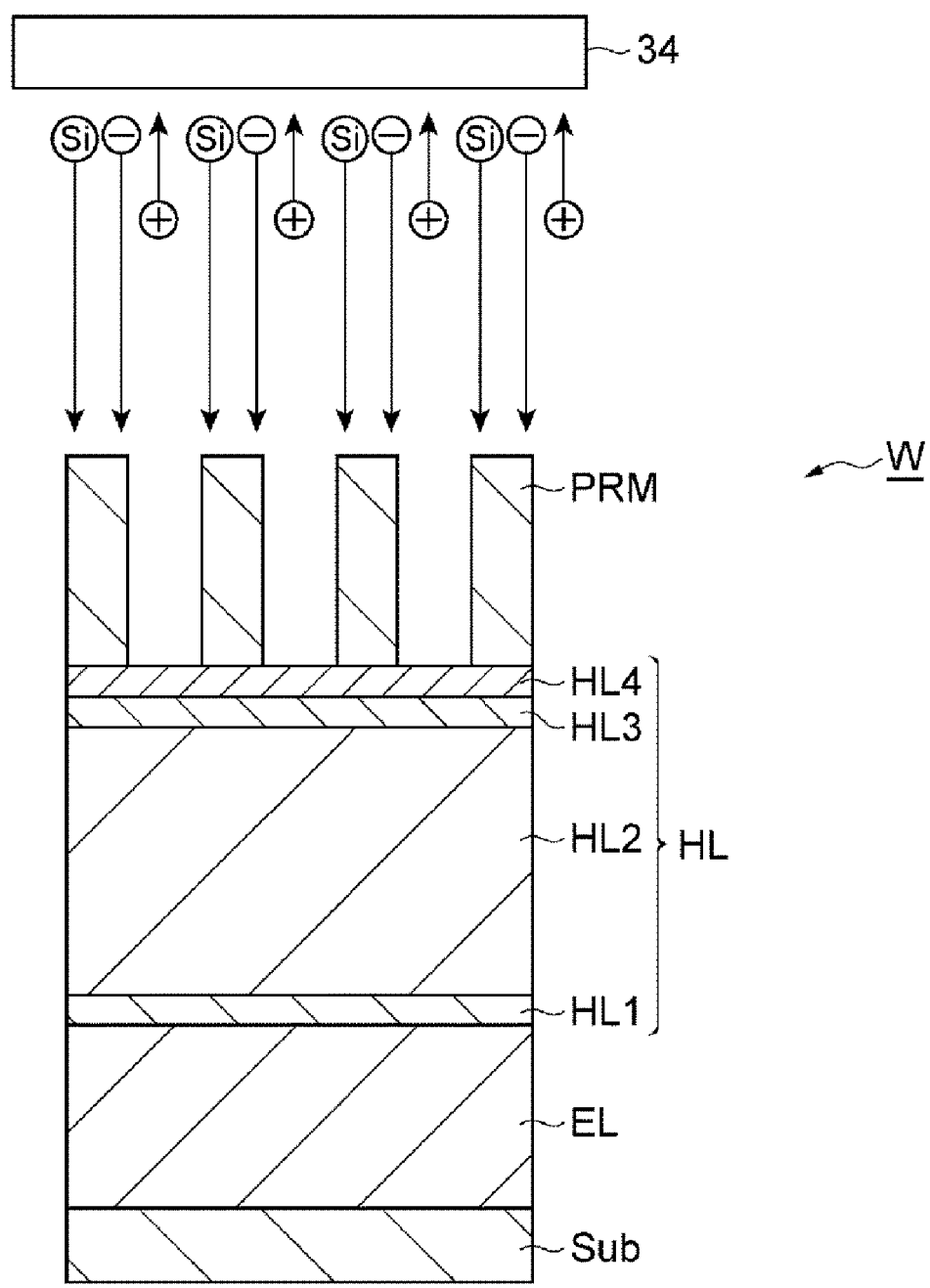
FIG. 8 is a diagram for describing a process S2.

In the process S2, positive ions generated as a result of exciting the plasma within the processing vessel 12 collide with the upper electrode 34, so that secondary electrons and silicon are emitted from the upper electrode 34, as shown in FIG. 8. In FIG. 8, a circled "+" symbol represents the positive ion, a circled "−" symbol represents secondary electrons, and a circled "Si" symbol indicates the silicon. In the process S2, the secondary electrons modify (reform) the quality of the resist mask PRM, and the silicon is deposited on a surface of the resist mask PRM to protect the resist mask PRM. That is, in the process S2, the silicon is deposited on the resist mask PRM through a PVD method, so that a protective film containing the silicon is deposited on the surface of the resist mask PRM.

Figure 21:
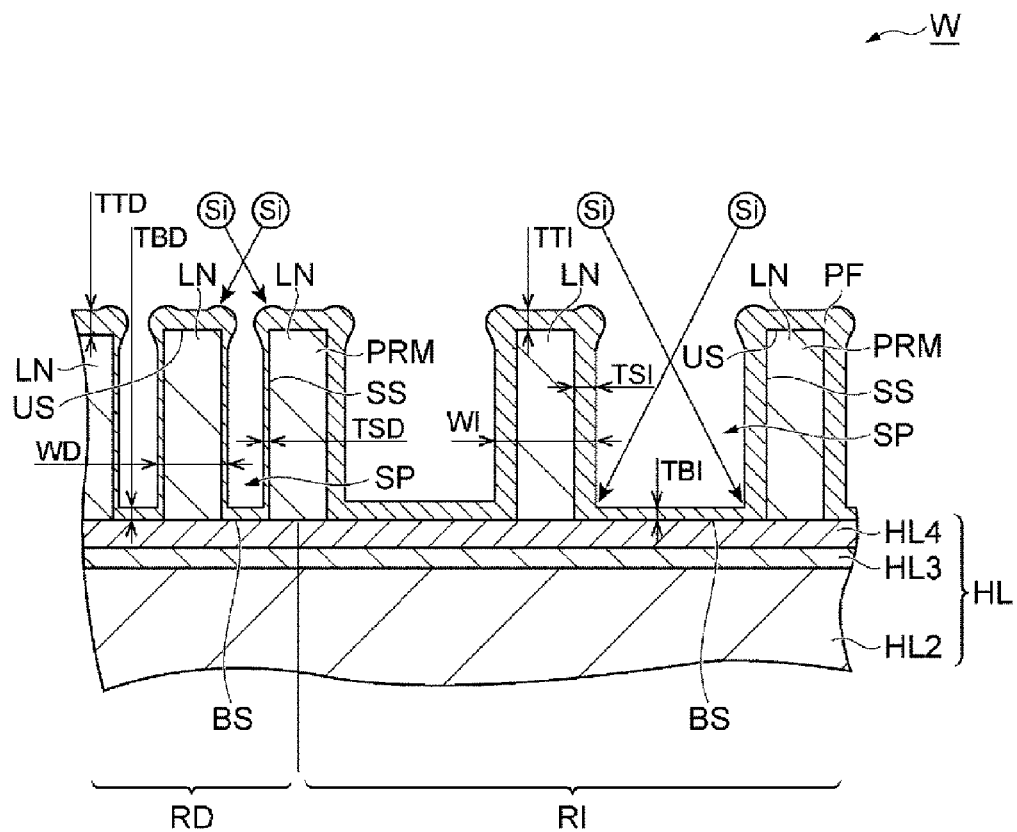
FIG. 21 is a diagram for describing a status where a protective film is formed on a resist mask through a plasma CVD method.
Figure 22:
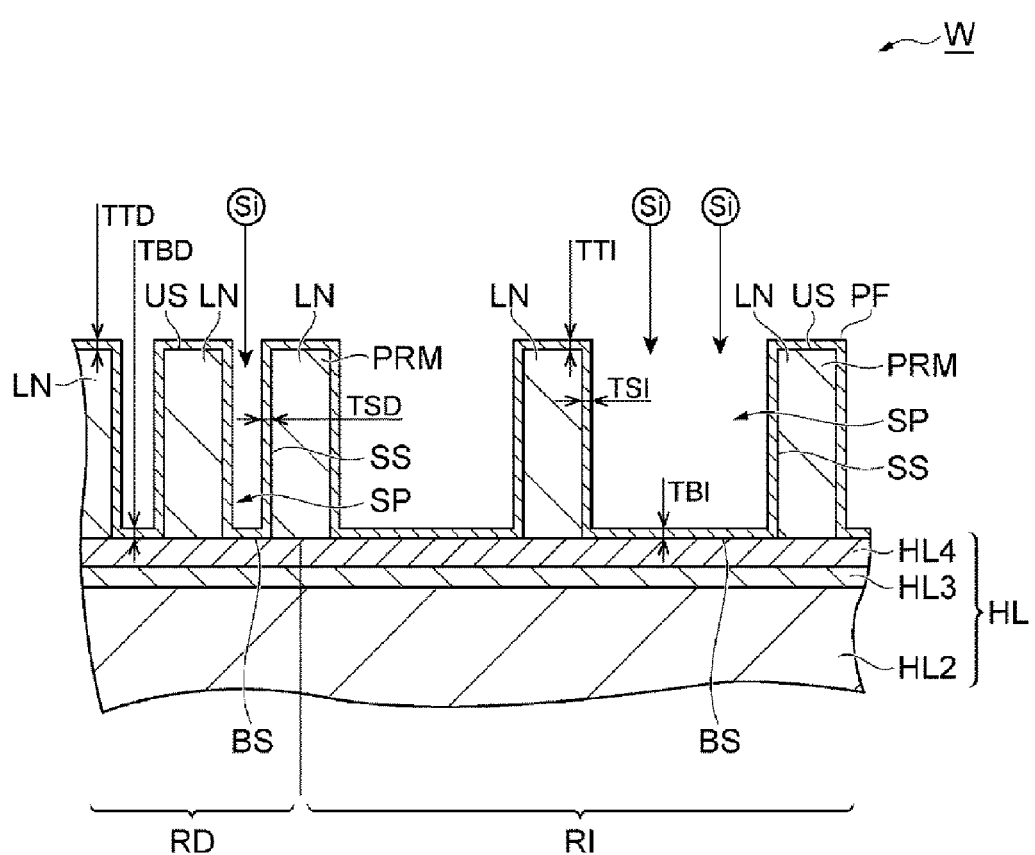
FIG. 22 is a diagram for describing a status where a protective film is formed on a resist mask through a PVD method in accordance with the example embodiment.

Here, referring to FIG. 21 and FIG. 22, a difference between a protective film formed by a plasma CVD method and a protective film formed by a PVD method will be explained. FIG. 21 is a diagram for describing a status where a protective film is formed on the resist mask through a plasma CVD method, and FIG. 22 is a diagram for describing a status where a protective film is formed on the resist mask through a PVD method in accordance with the example embodiment. As depicted in FIG. 21 and FIG. 22, the resist mask PRM may have a densely patterned region RD (hereinafter, referred to as "dense region RD") and a sparsely patterned region RI (hereinafter, referred to as "spare region RI"). Further, the pattern of the resist mask PRM may not be limited thereto. For example, the resist mask PRM may have a line-and-space pattern composed of a multiple number of lines LN. On the dense region RD, plural lines LN are formed at a small pitch, and, on the spare region RI, plural lines LN are formed at a relatively large pitch.

Considered as a general way to form a protective film made of silicon on such a resist mask PRM is a method of forming a protective film PF on the surface of the resist mask PRM by depositing the silicon on the resist mask through the plasma CVD method with a $SiCl_4$ gas or the like. In the plasma CVD method, the amount of Si radicals or radicals of Si-containing molecules as active species dissociated from the $SiCl_4$ gas is comparatively large. In FIG. 21, circled "Si" symbols indicate those radicals.

The radicals are irradiated to the resist mask PRM at various incident angles, as shown in FIG. 21. The radicals having such various incident angles can enter a space SP between adjacent lines LN on the spare region RI where a distance between the adjacent lines LN is relatively large. Accordingly, on the spare region RI, the radicals are irradiated to an upper surface US of the resist mask PRM, a side surface SS of the resist mask PRM forming the space SP between the adjacent lines LN and a bottom surface BS of the space SP in a relatively uniform manner. As a result, on the spare region RI, differences between a thickness of TTI of the protective film PF formed on the upper surface US, a thickness TSI of the protective film PF formed on the side surface SS and a thickness TBI of the protective film PF formed on the bottom surface BS are small.

Meanwhile, on the dense region RD where the distance between adjacent lines LN is short, the amount of radicals irradiated to the upper surface US of the resist mask PRM is large, whereas the amount of radicals introduced into the space SP between the adjacent lines LN is small, as illustrated in FIG. 21. Also, on the dense region RD, since the size of a top opening of the space SP is decreased due to the protective film PF formed thereat, it becomes difficult for the radicals to enter the space SP. As a result, on the dense region RD, while a thickness TTD of the protective film PF formed on the upper surface US is large, a thickness TSD of the protective film PF formed on the side surface SS and a thickness TBD of the protective film PF formed on the bottom surface BS are relatively small. Accordingly, if the plasma CVD method is used, a difference between a width WD of a structure including the line LN and the protective film PF on the dense region RD and a width WI of a structure including the line LN and the protective film PF on the sparse region RI is increased. As a result, with the plasma CVD method, it is difficult to control the dimensions of the etching mask for the hard mask HL to be uniform on the sparse region RI and the dense region RD.

On the other hand, in the process S2 in accordance with the example embodiment, silicon active species, which are emitted from the upper electrode 34 as a result of colliding the positive ions with the upper electrode 34, are irradiated to the resist mask PRM without using the CVD method. That is, in the process S2 in the example embodiment, the silicon active species are irradiated to the resist mask PRM by a PVD method. The silicon active species emitted from the upper electrode 34 are directed in various different directions. As the distance GAP between the upper electrode 34 and the target object W increases, the ratio of the silicon active species vertically incident on the target object W also increases. As such, as illustrated in FIG. 22, the silicon active species are irradiated to the target object W with high directionality. Accordingly, the silicon active species enter the spaces SP between the adjacent lines LN on both the dense region RD and the sparse region RI. As a result, ions are irradiated in a relatively uniform manner on the upper surfaces US of the resist mask PRM, the side surfaces SS of the resist mask PRM forming the space SP and the bottom surface BS of the space SP on both the dense region RD and the sparse region RI. Accordingly, respective differences between the thickness TTI of the protective film PF formed on the upper surface US of the resist mask PRM on the sparse region RI, the thickness TSI of the protective film PF formed on the side surface SS of the resist mask PRM on the sparse region RI, the thickness TBI of the protective film PF formed on the bottom surface BS of the space SP on the sparse region RI, the thickness TTD of the protective film PF formed on the upper surface US of the resist mask PRM on the dense region RD, and the thickness TSD of the protective film PF formed on the side surface SS of the resist mask PRM on the dense region RD and the thickness TBD of the protective film PF formed on the bottom surface BS of the space SP on the dense region RD are reduced. That is, in the process S2 in accordance with the example embodiment using the PVD method, it is possible to control the dimensions of the etching mask for the hard mask HL to be uniform on the sparse region RI and the dense region RD.

In addition, when carrying out the process S2, the distance between the upper electrode 34 and the mounting table 14 may be set to be the first distance nG or larger than the first distance nG. For example, when performing the process S2, the distance between the upper electrode 34 and the mounting table 14 may be equal to or larger than 100 mm. In addition, in the above-described method, the process S2 is performed after the process S1 and before a process S3. However, the process S2 may be performed at the same time as the process S1. In such a case, in the processes S1 and S2, rare gases, e.g., an Ar gas and a $H_2$ gas are supplied into the processing vessel 12. In addition, when performing the processes S1 and S2 at the same time, the distance between the upper electrode 34 and the mounting table 14 may be set to be the first distance nG or larger than the first distance nG. For example, when carrying out the processes S1 and S2 concurrently, the distance between the upper electrode 34 and the mounting table 14 may be set to be equal to or larger than 100 mm.

Figure 9:
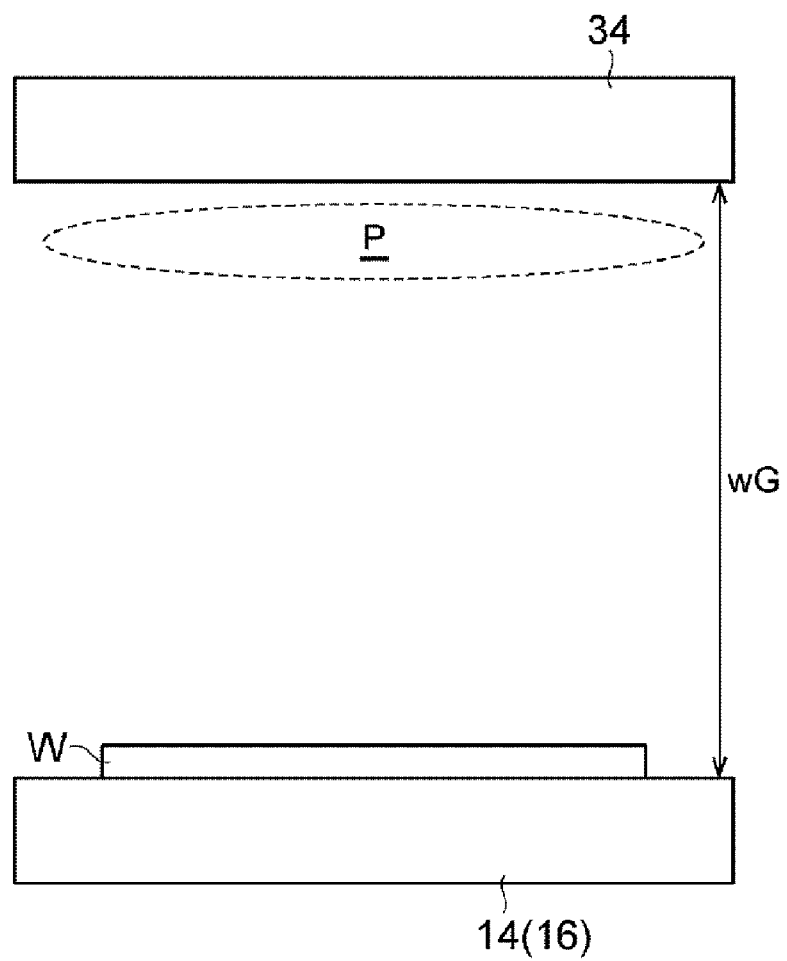
FIG. 9 is a diagram for describing a process S3.

Subsequently, referring back to FIG. 5, in the method of the example embodiment, the process S3 of etching the hard mask layer is carried out. In the process S3, the distance between the upper electrode 34 and the mounting table 14 is set to a second distance wG, which is larger than the first distance nG, and the etchant gas is excited into plasma within the processing vessel 12. That is, in the process S3, the target object W is processed in a region (i.e., a diffusion region) far from the region where the plasma P is generated, as illustrated in FIG. 9.

To be more specific, the second distance wG is set such that a Peclet number at each position on the mounting table 14, i.e., each position of the target object W is equal to or less than 1. The Peclet number (Pe) is represented by Equation (1) as follows.

$$Pe = uL/D_{AB} \tag{1}$$

Here, u denotes a flow velocity (m/s) of a gas; $D_{AB}$, an interdiffusion coefficient (m²/s) of a gas species; and L, a radius of the target object W as a representative length.

If the Peclet number is greater than 1, "flow" dominant gas movement occurs, whereas if the Peclet number is 1 or less, "diffusion" dominant gas movement takes place. The second distance wG that allows the Peclet number to be 1 or less is, for example, 100 mm or larger. Accordingly, by setting the second distance wG such that the Peclet number at each position of the target object W is 1 or less, the target object W is processed in the diffusion region of the plasma P.

In addition, the second distance wG, i.e., the region where the target object W is processed in the process S3 may also be defined by using a stay time, i.e., a residence time of a gas on the mounting table 14, i.e., on the target object W. Here, the residence time is in proportion to a volume and a pressure of the processing space S and is in inverse proportion to a flow rate of the gas. When the volume of the processing space S is V (liter), the pressure of the processing space S is P (Torr) and a flow rate of the gas is Q (sccm), the residence time (r (second)) is represented by Equation (2) as follows.

$$\tau = (P \times V)/(Q) \tag{2}$$

Figure 10:
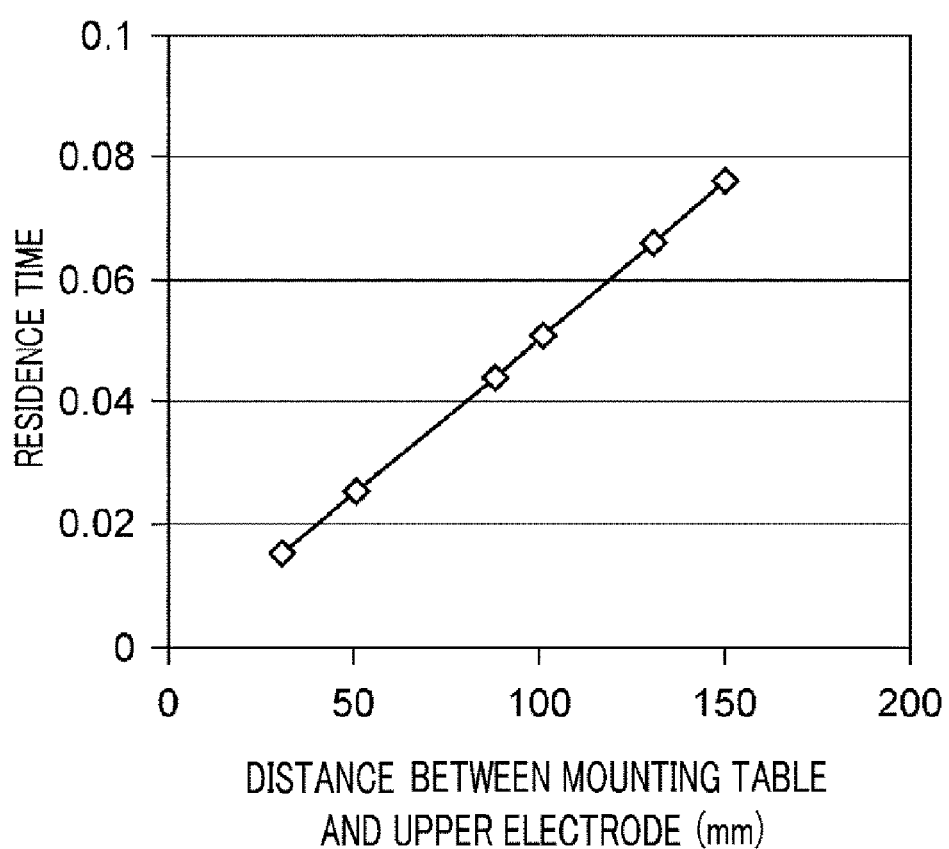
FIG. 10 is a chart showing a relationship between a residence time and a distance between a mounting table and an upper electrode.

If the pressure P of the processing space S and the flow rate Q of the gas are constant, the volume V of the processing space S increases with an increase of the distance between the mounting table 14 and the upper electrode 34, and accordingly, the residence time also increases. If the residence time is lengthened, the gas may easily stay within the processing space S. Accordingly, in a "flow" component and a "diffusion" component of the gas within the processing space S, the "diffusion" component becomes dominant. FIG. 10 shows a relationship between the residence time and the distance between the mounting table 14 and the upper electrode 34 when the pressure of the processing space S is maintained constant at 10 mTorr (1.333 Pa) and the flow rate of the gas is maintained constant at 20 sccm. For example, when the residence time is about 0.05 seconds or longer, the diffusion component becomes dominant in the gas movement. Accordingly, the second distance wG can be set to be equal to or larger than 100 mm, as illustrated in FIG. 10.

As described above, in the process S3, the target object W is processed in the diffusion region of the plasma P, and, as a result, non-uniformity in the processing rate on the entire region of the target object W is reduced and non-uniformity in the dimensions of the pattern formed on the hard mask layer HL is also reduced. Further, since the target object W is processed in the diffusion region in the process S3, a processing time of the process S3 may be increased. Since, however, the processing time of the process S1 can be shortened as stated above, the influence of the processing time of the process S3 upon the total processing time of the present method can be reduced.

Hereinafter, the process S3 will be described in detail with reference to FIG. 9 and FIG. 11 to FIG. 14. First, when carrying out the process S3 in the plasma processing apparatus 10, the motors 70 are driven in response to a control signal from the controller Cnt, and, as illustrated in FIG. 9, the distance between the upper electrode 34 and the mounting table 14 is set to the second distance wG.

Figure 11:
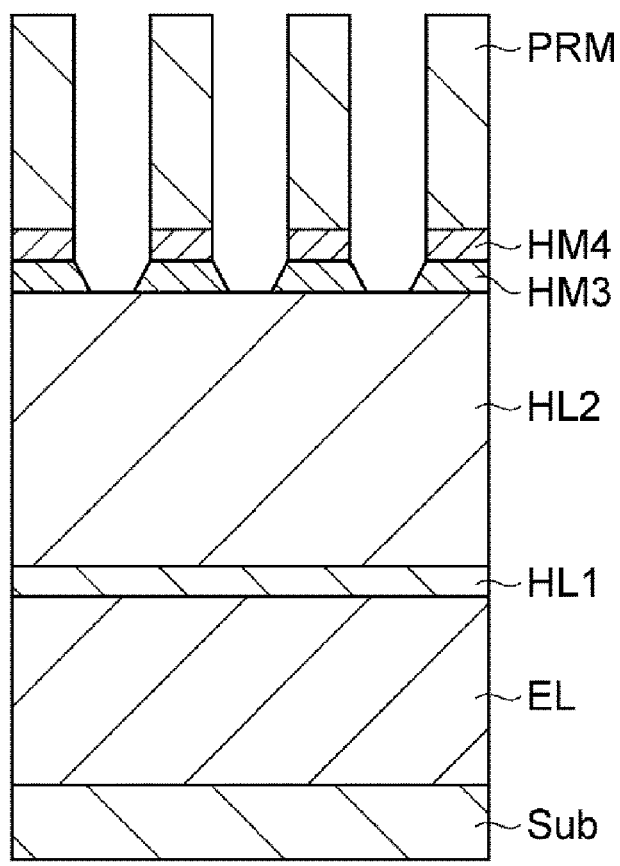
FIG. 11 is a diagram illustrating a target object on which the process S3 is performed.

Subsequently, in the process S3, the fourth layer HL4 and the third layer HL3 are etched, so that the masks HM3 and HM4 are formed, as illustrated in FIG. 11. When performing this process in the plasma processing apparatus 10, a $CF_4$ gas, a $CHF_3$ gas and an $O_2$ gas are respectively supplied from the gas sources GS3 to GS5 into the processing vessel 12 in response to control signals from the controller Cnt, and a high frequency power is supplied to the upper electrode 34. As a result, plasma is excited within the processing vessel 12, and a pattern of the resist mask PRM is transcribed onto the fourth layer HL4 and the third layer HL3, so that the masks HM3 and HM4 are formed.

Figure 12:
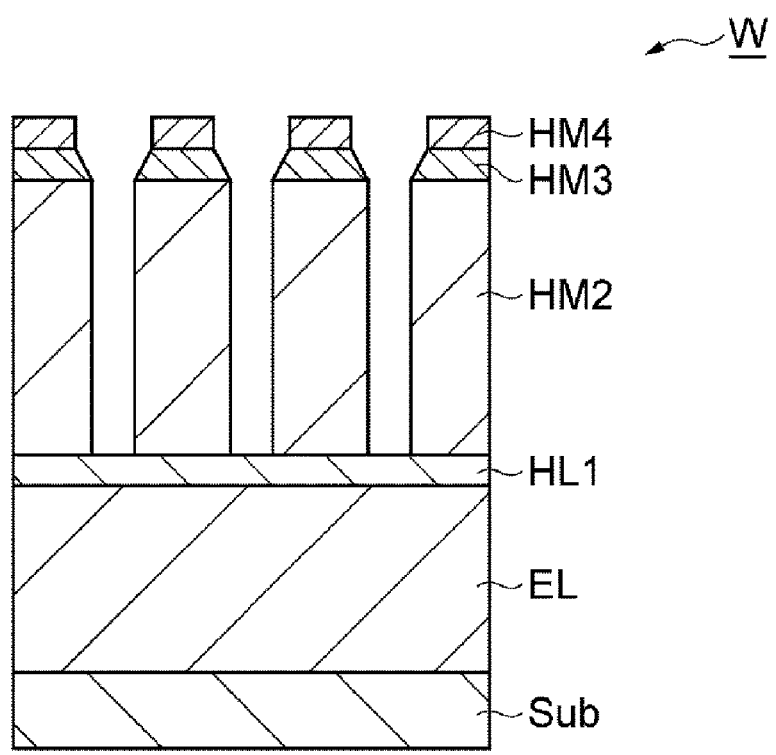
FIG. 12 is a diagram illustrating the target object on which the process S3 is performed.

Then, in the process S3, the second layer HL2 is etched, so that a mask HM2 is formed, as illustrated in FIG. 12. When carrying out this process in the plasma processing apparatus 10, an $O_2$ gas, a HBr gas, and a He gas are respectively supplied from the gas sources GS5 to GS7 into the processing vessel 12 in response to control signals from the controller Cnt, and a high frequency power is supplied to the upper electrode 34. As a result, plasma is excited within the processing vessel 12, and patterns of the masks HM3 and HM4 are transcribed onto the second layer HL2, so that the mask HM2 is formed. In this process, since plasma of the oxygen gas is excited, the resist mask PRM is removed. Further, in the etching of the second layer HL2 in the process S3, an Ar gas from the gas source GS10 may be supplied instead of the He gas.

Figure 13:
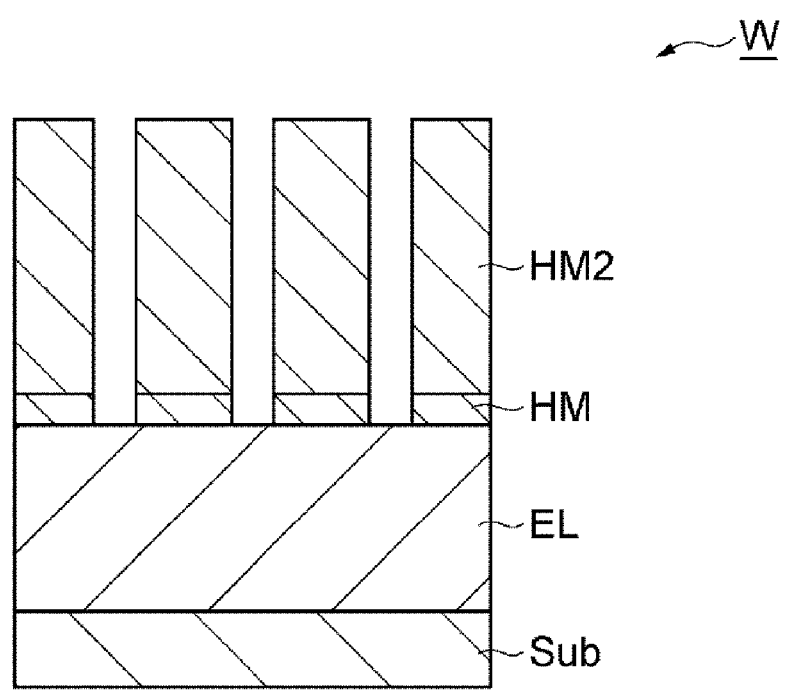
FIG. 13 is a diagram illustrating the target object on which the process S3 is performed.

Further, in the process S3, the first layer HL1 is etched, so that a mask HM is formed, as illustrated in FIG. 13. When carrying out this process in the plasma processing apparatus 10, a $Cl_2$ gas is supplied from the gas source GS8 into the processing vessel 12 in response to a control signal from the controller Cnt, and a high frequency power is supplied to the upper electrode 34. As a result, plasma of the chlorine gas is excited within the processing vessel 12, and a pattern of the mask HM2 is transcribed onto the first layer HL1, so that the hard mask HM is formed. In this process, since plasma of the chlorine gas is excited, the masks HM3 and HM4 are removed. Furthermore, in the etching of the first layer HL1 in the process S3, in addition to the $Cl_2$ gas, an Ar gas from the gas source GS10 and a $CH_4$ gas from the gas source GS11 may be supplied.

Subsequently, in the process S3, by exciting plasma of the oxygen gas within the processing vessel 12, the mask HM2 is removed. Accordingly, as illustrated in FIG. 14, the target object W having the hard mask HM on the etching target layer EL is obtained.

Figure 15:
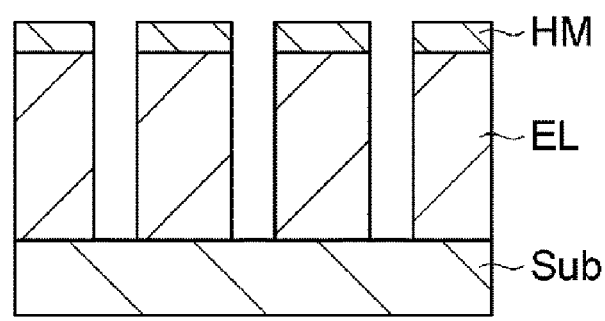
FIG. 15 is a diagram illustrating the target object on which a process S4 is performed.

Thereafter, in the present method, a process S4 of etching the etching target layer EL is carried out. In the process S4, the distance between the upper electrode 34 and the mounting table 14 with the target object W mounted thereon as shown in FIG. 14 is set to a distance shorter than the second distance wG. In the example embodiment, the distance between the mounting table 14 and the upper electrode 34 in the process S4 is set to the first distance nG. In addition, in the process S4, plasma of an etchant gas for etching the etching target layer EL, i.e., a fluorocarbon-based gas is excited within the processing vessel 12. As a result, as illustrated in FIG. 15, a pattern of the hard mask HM is transcribed onto the etching target layer EL.

When carrying out the process S4 in the plasma processing apparatus 10, the motors 70 are driven in response to a control signal from the controller Cnt, and the distance between the upper electrode 34 and the mounting table 14 is set to a distance shorter than the second distance wG, e.g., set to the first distance nG. Further, a $C_4F_8$ gas is supplied from the gas source GS9 into the processing vessel 12 in response to a control signal from the controller Cnt, and a high frequency power is supplied to the upper electrode 34. As a result, plasma P of the $C_4F_8$ gas is excited within the processing vessel 12. In addition, in the process S4, along with the $C_4F_8$ gas, a $CF_4$ gas from the gas source GS3 and a $CH_2F_2$ gas from the gas source GS12 may be supplied.

Figure 16:
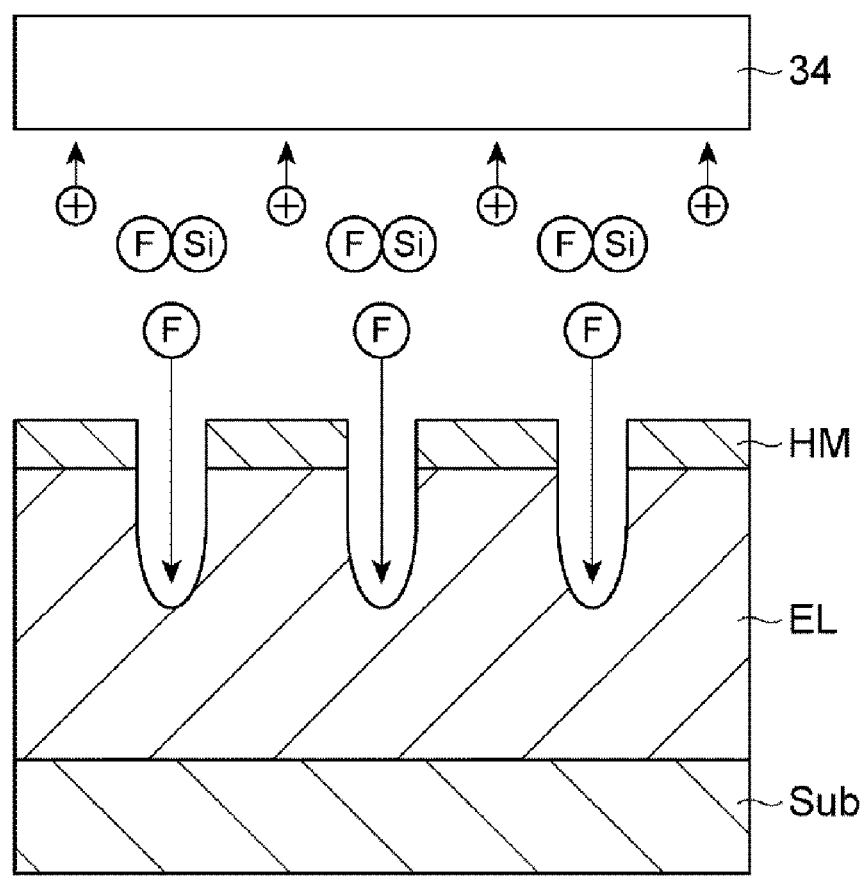
FIG. 16 is a diagram for describing the process S4.

In addition, in the example embodiment, a negative DC voltage may be applied to the upper electrode 34 in the process S4. Specifically, the switch SW2 is closed in response to a control signal from the controller Cnt, and a negative DC voltage generated by the DC power supply 45 is applied to the inner electrode portion 34a. In the process S4, as illustrated in FIG. 16, positive ions generated within the processing vessel 12 are accelerated by applying the negative DC voltage to the inner electrode portion 34a to collide with the upper electrode 34, so that silicon is emitted from the upper electrode 34. The emitted silicon is bonded with active species of fluorine such as fluorine ions or fluorine radicals being generated within the processing vessel 12. As a result, in the process S4, the amount of the active species of fluorine is reduced. Further, in FIG. 16, a circled "+" symbol indicates a positive ion; a circled "−" symbol, a secondary electron; and a circled "Si" symbol, silicon.

The active species of fluorine contribute to the etching of the etching target layer EL, and, in the meantime, the active species of fluorine also etch the hard mask HM made of TiN. In the process S4, the target object W is processed at a position close to the upper electrode 34, i.e., at a position close to a plasma generation region. In the process S4 in accordance with the example embodiment, since the silicon is bonded with the active species of fluorine as mentioned above, it is possible to reduce the active species of fluorine which are excessively generated. As a result, the thickness of the hard mask HM remaining upon the completion of the etching of the etching target layer EL can be increased.

Although the various example embodiments have been described, the above-described example embodiments are not limiting, and various changes and modifications may be made. For example, the plasma processing apparatus according to the above-described example embodiment adopts the configuration in which the mounting table 14 serving as the lower electrode is moved in the direction of the axial line Z. Instead, however, the plasma processing apparatus may adopt a configuration in which the upper electrode 34 is moved in the direction of the axial line Z.

Hereinafter, experimental examples conducted by using the plasma processing apparatus 10 will be explained.

EXPERIMENTAL EXAMPLES 1 AND 2

A curing process (process S1) is performed on a resist mask PRM of a target object W having a diameter of 300 mm in Experimental Examples 1 and 2 where a distance between the mounting table 14 and the upper electrode 34 is set to 35 mm and 130 mm, respectively. In each of the Experimental Examples 1 and 2, a resist mask which has a thickness of 75 nm and a line-and-space pattern with a line of a width of 50 nm and a space of a width of 50 nm is used as the resist mask PRM. Further, in both of the Experimental Examples 1 and 2, a processing time of the process S1 is varied as a parameter. The other conditions for the Experimental Examples 1 and 2 are as follows. In the following, the step number of the variable capacitor 40*d*, i.e., CPI is a unit of changing a capacitance of the variable capacitor 40*d*, and a value of CPI is proportional to the capacitance of the variable capacitor 40*d*.

Pressure within the processing vessel 12: 50 mTorr (6.66 Pa)

Frequency of a high frequency power of the high frequency power supply 44: 60 MHz Power of the high frequency power of the high frequency power supply 44: 300 W Frequency of a high frequency power of the high frequency power supply 20: 13 MHz Power of the high frequency power of the high frequency power supply 20: 0 W $H_2$ gas flow rate: 120 sccm $N_2$ gas flow rate: 180 sccm Gas split ratio into the buffer room 34*c* and the buffer room 34*d*: 50:50

Temperature of the central region of the electrostatic chuck 18: 30° C.

Temperature of the edge region of the electrostatic chuck 18: 30° C.

Coolant temperature of the chiller unit 26: 10° C.

CPI: 36 steps

Figure 17A:
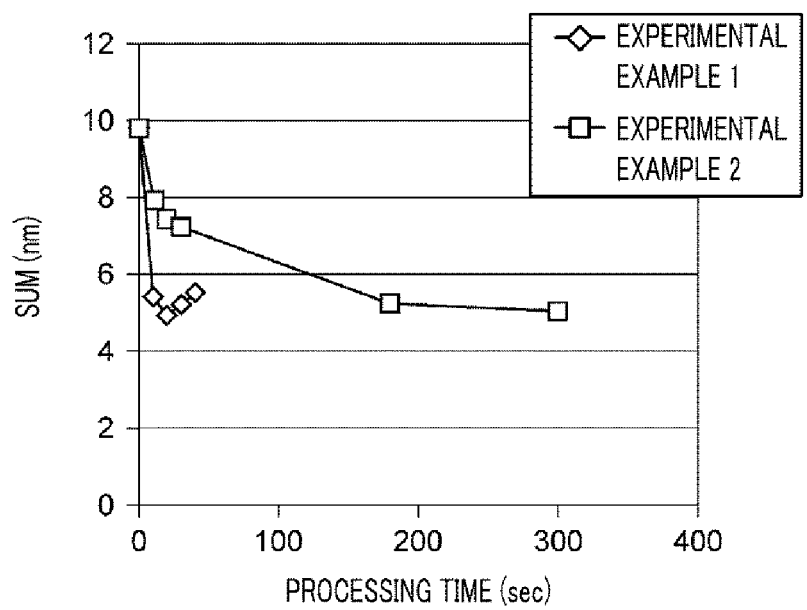
FIG. 17A and FIG. 17B are diagrams showing results of experimental examples 1 and 2.
Figure 17B:
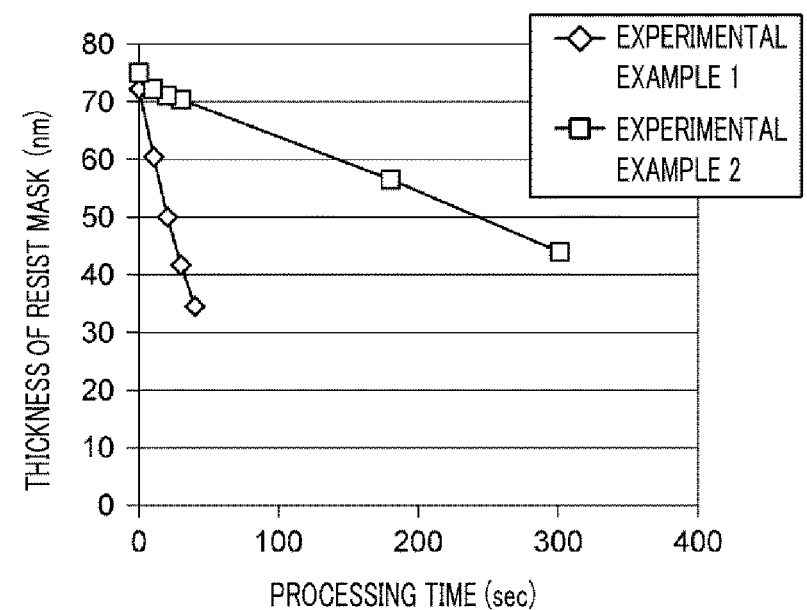

In the Experimental Examples 1 and 2, a sum of a LWR, a LER and a SWR is calculated from a SEM image of the resist mask PRM after the completion of the process S1, and a thickness of the resist mask PRM after the completion of the process S1 is also measured. FIG. 17A and FIG. 17B show the results of the Experimental Examples 1 and 2. FIG. 17A provides a graph showing a relationship between the processing time of the process S1 and the sum of the LWR, the LER and the SWR of the resist mask PRM in each of the Experimental Examples 1 and 2. Further, FIG. 17B provides a graph showing a relationship between the processing time of the process S1 and the thickness of the resist mask PRM in each of the Experimental Examples 1 and 2.

As can be seen from FIG. 17A, in the Experimental Example 1, the processing time is about 20 seconds, and the sum of the LWR, the LER and the SWR is found to be of a minimum value (about 5 nm). Meanwhile, in the Experimental Example 2, it is found out that the sum of the LWR, the LER and the SWR does not reach the same value as the minimum value of the sum thereof in the Experimental Example 1 even when the processing time reaches 300 seconds. From this result, it is proved that a dimensional accuracy of the resists mask PRM can be improved in a short time by performing the curing process (process S1) of the resist mask PRM in the state that the target object W is positioned near the plasma generation region.

In addition, as can be seen from FIG. 17B, the resist mask PRM has a thickness of 50 nm after the lapse of the processing time of 20 seconds in the Experimental Example 1, whereas the resist mask PRM has a thickness of 43 nm after the lapse of the processing time of 300 seconds in the Experimental Example 2. From this result, it is proved that the thickness of the resist mask PRM at the time of completing the process S1 can be increased by carrying out the curing process (process S1) of the resist mask PRM in a short time under the state that the target object W is positioned near the plasma generation region.

EXPERIMENTAL EXAMPLES 3 TO 6

In Experimental Example 3, a target object having a resist mask evenly formed on a substrate having a diameter of 300 mm is prepared, and the resist mask is etched by using a mixture gas of a $CF_4$ gas and an $O_2$ gas, while varying a flow rate of the $O_2$ gas as a parameter. In Experimental Example 4, a target object having a $SiO_2$ layer evenly formed on a substrate having a diameter of 300 mm is prepared, and the $SiO_2$ layer is etched by using a mixture gas of a $CF_4$ gas and an $O_2$ gas, while varying a flow rate of the $O_2$ gas as a parameter. In the etching by the mixture gas of the $CF_4$ gas and the $O_2$ gas as the etchant gas, $SiO_2$ has a similar characteristic to that of a material forming a hard mask layer. Below are the other conditions for the Experimental Examples 3 and 4.

Pressure within the processing vessel 12: 50 mTorr (6.66 Pa)

Frequency of a high frequency power of the high frequency power supply 44: 60 MHz Power of the high frequency power of the high frequency power supply 44: 500 W Frequency of a high frequency power of the high frequency power supply 20: 13 MHz Power of the high frequency power of the high frequency power supply 20: 100 W $CF_4$ gas flow rate: 200 sccm Gas split ratio into the buffer rooms 34*c* and 34*d*: 50:50

Temperature of the central region of the electrostatic chuck 18: 30° C.

Temperature of the edge region of the electrostatic chuck 18: 30° C.

Coolant temperature of the chiller unit 26: 10° C.

CPI: 36 steps

Distance between the upper electrode 34 and the mounting table 14: 150 mm Etching time: 60 seconds In addition, in Experimental Example 5, a target object having a resist mask evenly formed on a substrate having a diameter of 300 mm is prepared, and the resist mask is etched by using a mixture gas of a $CF_4$ gas and an $O_2$ gas, while varying a power of a high frequency power of the high frequency power supply 20 as a parameter. In Experimental Example 6, a target object having a $SiO_2$ layer evenly formed on a substrate having a diameter of 300 mm is prepared, and the $SiO_2$ layer is etched by using a mixture gas of a $CF_4$ gas and an $O_2$ gas, while varying a power of a high frequency power of the high frequency power supply 20 as a parameter. Below are the other conditions for the Experimental Examples 5 and 6.

Pressure within the processing vessel 12: 50 mTorr (6.66 Pa)

Frequency of a high frequency power of the high frequency power supply 44: 60 MHz Power of the high frequency power of the high frequency power supply 44: 500 W Frequency of the high frequency power of the high frequency power supply 20: 13 MHz $CF_4$ gas flow rate: 200 sccm $O_2$ gas flow rate: 20 sccm Gas split ratio into the buffer rooms 34*c* and 34*d*: 50:50

Temperature of the central region of the electrostatic chuck 18: 30° C.

Temperature of the edge region of the electrostatic chuck 18: 30° C.

Coolant temperature of the chiller unit 26: 10° C.

Distance between the upper electrode 34 and the mounting table 14: 150 mm CPI: 36 steps Etching time: 60 seconds In each of the Experimental Examples 3 and 5, etching rates of the resist mask at a multiple number of points on the diameter of the target object are calculated from a thickness of the resist mask prior to the etching, a thickness of the resist mask after the etching and the etching time. Further, in each of the Experimental Examples 4 and 6, etching rates of the $SiO_2$ layer at a multiple number of points on the diameter of the target object are calculated from a thickness of the $SiO_2$ layer prior to the etching, a thickness of the $SiO_2$ layer after the etching and the etching time.

Figure 18A:
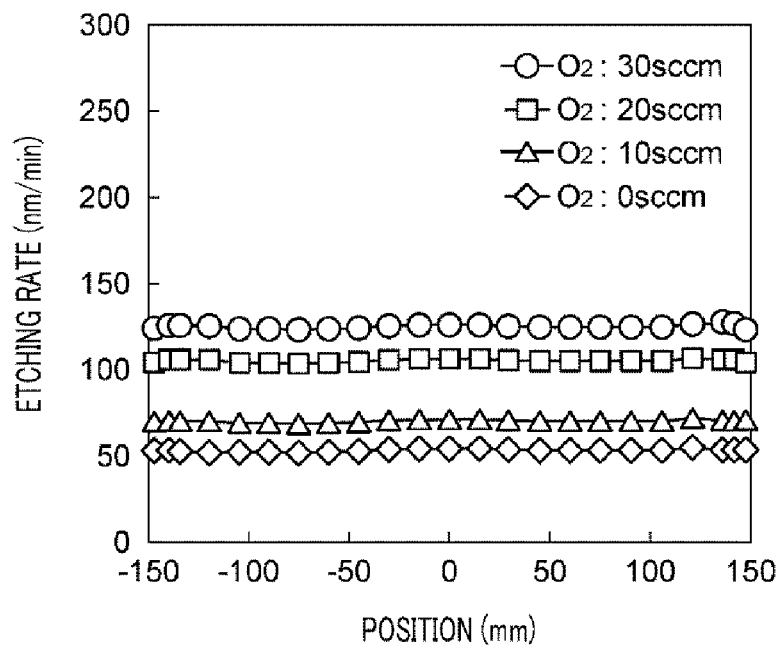
FIG. 18A and FIG. 18B are diagrams showing results of experimental example 3 and 4.
Figure 18B:
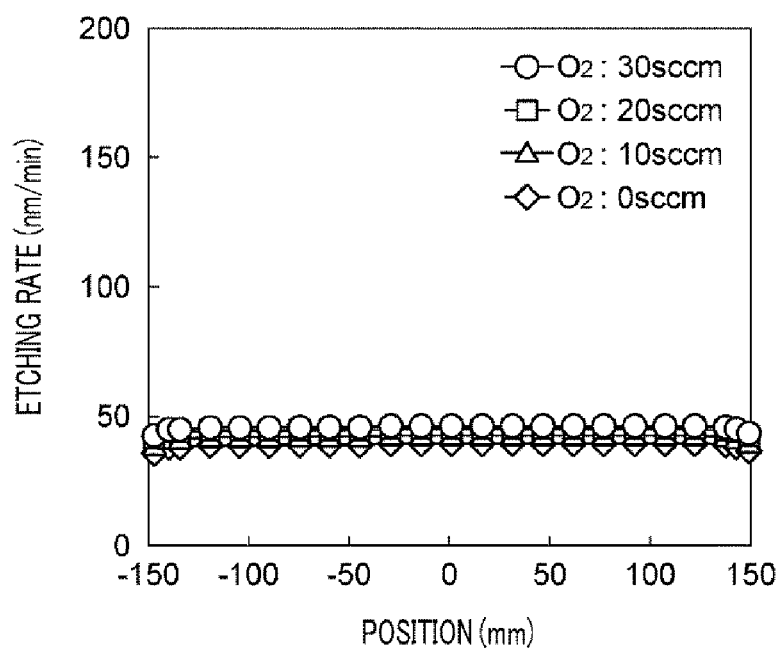
Figure 19A:
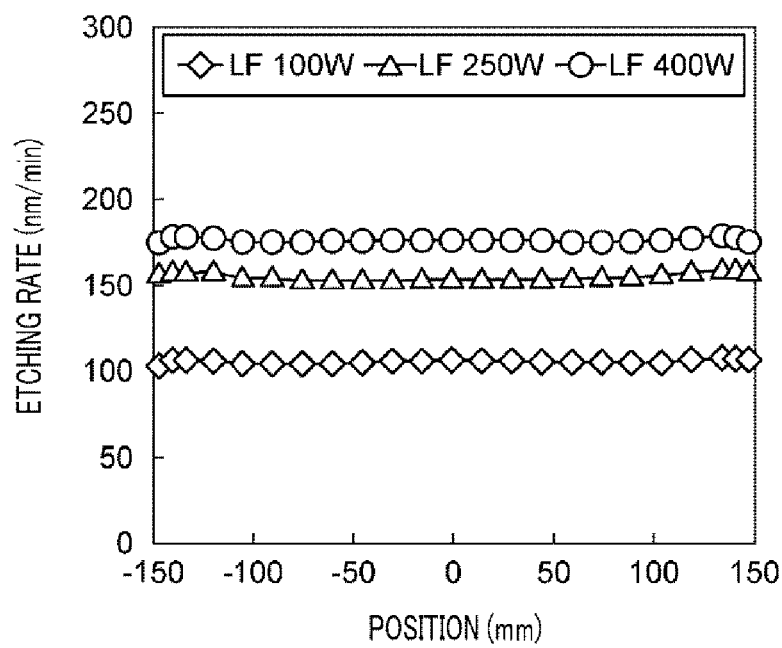
FIG. 19A and FIG. 19B are diagrams showing results of experimental examples 5 and 6.
Figure 19B:
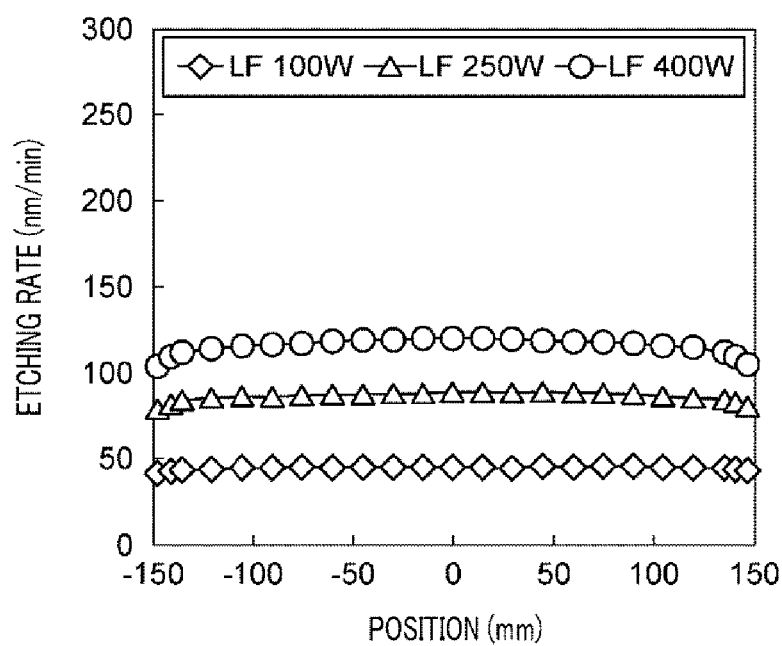

FIG. 18A and FIG. 18B show the results of the Experimental Examples 3 and 4, and FIG. 19A and FIG. 19B provide the results of the Experimental Examples 5 and 6. FIG. 18A depicts the result of the Experimental Example 3 in which the flow rate of the $O_2$ gas is varied as a parameter, i.e., it depicts the etching rates of the resist mask calculated at the multiple number of the points on the diameter of the target object. FIG. 18B depicts the result of the Experimental Example 4 in which the flow rate of the $O_2$ gas is varied as a parameter, i.e., it depicts the etching rates of the $SiO_2$ layer calculated at the multiple number of the points on the diameter of the target object. FIG. 19A shows the result of the Experimental Example 5 in which the power LF of the high frequency power of the high frequency power supply 20 is varied as a parameter, i.e., it depicts the etching rates of the resist mask calculated at the multiple number of the points on the diameter of the target object. FIG. 19B shows the result of the Experimental Example 6 in which the power LF of the high frequency power of the high frequency power supply 20 is varied as a parameter, i.e., it depicts the etching rates of the $SiO_2$ layer calculated at the multiple number of the points on the diameter of the target object. In addition, in each of the graphs shown in FIG. 18A, FIG. 18B, FIG. 19A and FIG. 19B, a horizontal axis indicates the positions of the target object on the diameter thereof when a center of the target object is set as "0."

As shown in FIG. 18A and FIG. 18B, from the Experimental Examples 3 and 4, it is confirmed that etching rate between the $SiO_2$ layer and the resist mask can be controlled by adjusting the flow rate of the $O_2$ gas. In addition, as can be seen from FIG. 19A and FIG. 19B, it is confirmed from the Experimental Examples 5 and 6 that the etching rate of each of the $SiO_2$ layer and the resist mask can be controlled by adjusting the power of the high frequency power of the high frequency power 20, i.e., the high frequency bias power. In addition, as shown in FIG. 18A to FIG. 19B, it is also confirmed from the Experimental Examples 3 to 6 that by processing the target object in the diffusion region, non-uniformity of the etching rates at the individual positions on the diameter of the target object is reduced even when the flow rate of the $O_2$ gas or the power of the high frequency power of the high frequency power supply 20 is varied.

EXPERIMENTAL EXAMPLES 7 TO 9

A hard mask layer of a target object having a diameter of 300 mm is etched in Experimental Examples 7 to 9 where a distance between the mounting table 14 and the upper electrode 34 is set to 87 mm, 130 mm and 170 m, respectively. In each of the Experimental Examples 7 to 9, the target object includes, as a hard mask layer HL, a SOH layer HL2 with a thickness of 100 nm formed on the target object; and an antireflection film (Si-ARC) HL4 formed on the SOH layer HL2. Further, the target object also includes, as a resist mask PRM, an ArF resist mask with a thickness of 120 nm formed on the Si-ARC. The resist mask has a line-and-space pattern having a line with a width of 50 nm and a space with a width of 50 nm. Below are the other conditions for the Experimental Examples 7 to 9.

<Etching of Si-ARC>
Pressure within the processing vessel 12: 10 mTorr (1.33 Pa)
Frequency of a high frequency power of the high frequency power supply 44: 60 MHz
Power of the high frequency power of the high frequency power supply 44: 500 W
Frequency of a high frequency power of the high frequency power supply 20: 13 MHz
Power of the high frequency power of the high frequency power supply 20: 50 W
Gas split ratio into the buffer rooms 34c and 34d: 50:50
Temperature of the central region of the electrostatic chuck 18: 30° C.
Temperature of the edge region of the electrostatic chuck 18: 30° C.
Coolant temperature of the chiller unit 26: 10° C.
CPI: 36 steps
Etchant gas: $CF_4$ gas (150 sccm), $CHF_3$ gas (75 sccm), $O_2$ gas (5 sccm)
Etching time: 226 nm 43 seconds by using end point detection (EPD)

<Etching of SOH Layer>
Pressure within the processing vessel 12: 10 mTorr (1.33 Pa)
Frequency of a high frequency power of the high frequency power supply 44: 60 MHz
Power of the high frequency power of the high frequency power supply 44: 500 W
Frequency of a high frequency power of the high frequency power supply 20: 13 MHz
Power of the high frequency power of the high frequency power supply 20: 100 W
Gas split ratio into the buffer rooms 34c and 34d: 50:50
Temperature of the center region of the electrostatic chuck 18: 30° C.
Temperature of the edge region of the electrostatic chuck 18: 30° C.
Coolant temperature of the chiller unit 26: 10° C.
CPI: 36 steps
Etchant gas: $O_2$ gas (20 sccm), Ar gas (200 sccm)
Etching time: 226 nm 90 seconds by using end point detection (EPD)

In the Experimental Examples 7 to 9, a width (CD value) of a line formed from the hard mask layer HL after etching the SOH layer is measured, and, then, 3σ of that width is calculated. The 3σ values in the Experimental Examples 7 to 9 are 5.1 nm, 3.7 nm, and 3.1 nm, respectively. Accordingly, from the Experimental Examples 7 to 9, it is confirmed that non-uniformity of the CD value can be reduced by setting the distance between the upper electrode 34 and the mounting table 14 to be large and, also, by etching the hard mask layer HL in the diffusion region, as in the Experimental Examples 8 and 9.

Figure 20:
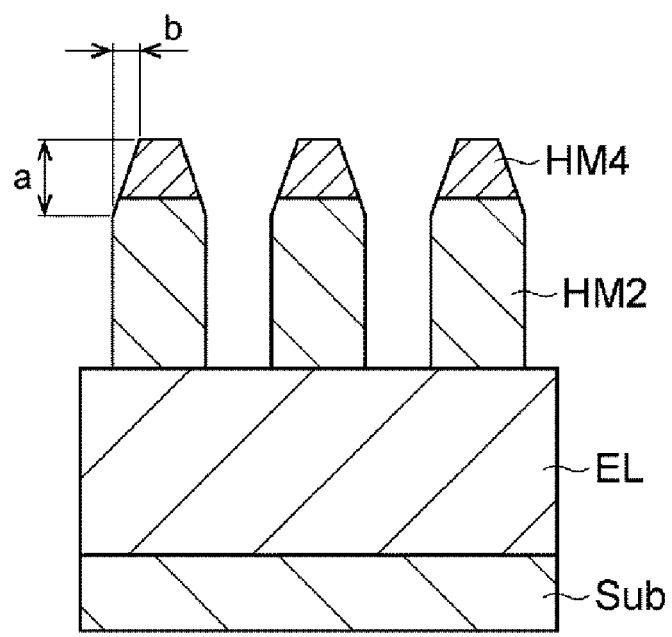
FIG. 20 is a diagram illustrating a cross sectional shape of a hard mask and an evaluation method for experimental examples 8 and 9.

In addition, SEM images of cross sections of the target objects obtained in the Experimental Examples 8 and 9 are captured, and, then, cross sections of a mask HM2 formed from the SOH layer HL2 and a mask HM4 formed from the antireflection film HL4 are observed. As illustrated in FIG. 20, an upper edge portion of the stacked body of the masks HM2 and HM4 obtained in each of the Experimental Examples 8 and 9 is obliquely cut to be sloped. Here, a height a and a width b of the slope is measured at each of a central region and an edge region of the target object, and an absolute value |Δa| of a difference between the height a of the slope at the central region and the height a of the slope at the edge region and an absolute value |Δb| of a difference between the width b of the slope at the central region and the width b of the slope at the edge region are calculated. Then, a value of |Δa|+|Δb| is calculated. As a result, the value of |Δa|+|Δb| of the target object obtained in the Experimental Example 8 is 17.2 nm, and the value of |Δa|+|Δb| of the target object obtained in the Experimental Example 9 is 1.7 nm. From this result, it is confirmed that as the distance between the upper electrode 34 and the mounting table 14 increases, the difference between the cross sectional shape of the hard mask at the central region of the target object and the cross sectional shape of the hard mask at the edge region of the target object is reduced.

EXPERIMENTAL EXAMPLE 10

In Experimental Example 10, a hard mask layer is etched by using the same target object as that used in the Experimental Example 8 while setting CPI to 110. The other conditions for the Experimental Example 10 are the same as those in the Experimental Example 8. A SEM image of the target object obtained in the Experimental Example 10 is captured, and a value of |Δa|+|Δb| is calculated. As a result, the value of |Δa|+|Δb| of the Experimental Example 10 is found to be 5.3 nm. As can be seen from the values |Δa|+|Δb| of the Experimental Example 8 and the Experimental Example 10, a difference in the shapes of the hard mask formed at the center region and the edge region of the target object can be reduced by relatively adjusting the power of the high frequency power to be applied to the inner electrode portion 34a and the power of the high frequency power to be applied to the outer electrode portion 34b.

EXPERIMENTAL EXAMPLES 11 AND 12

In Experimental Example 11, the processes S1 to S4 are performed on the target object W shown in FIG. 4. Also, in Experimental Example 12, the processes S1 to S4 are performed on the target object W shown in FIG. 4. In this the Experimental Example 12, however, a negative DC voltage is not applied to the upper electrode 34 in the process S4. Details of the target objects W used in the Experimental Examples 11 and 12 and conditions for the processes S1 to S4 in the Experimental Examples 11 and 12 are as follows.

<Target Object W>
Diameter: 300 mm
Etching target layer EL: Methanosilicate layer (500 nm)
First layer HL1: TiN layer (30 nm)
Second layer HL2: SOH layer (200 nm)
Third layer HL3: SiON layer (30 nm)
Fourth layer HL4: Si-ARC (35 nm)
Resist mask PRM: ArF resist mask (120 nm), a line-and-space pattern with a line width of 50 nm and a space width of 50 nm
<Process S1>
Pressure within the processing vessel 12: 50 mTorr (6.66 Pa)
Frequency of a high frequency power of the high frequency power supply 44: 60 MHz
Power of the high frequency power of the high frequency power supply 44: 300 W
Frequency of a high frequency power of the high frequency power supply 20: 13 MHz
Power of the high frequency power of the high frequency power supply 20: 0 W
$H_2$ gas flow rate: 120 sccm
$N_2$ gas flow rate: 180 sccm
Gas split ratio into the buffer rooms 34c and 34d: 50:50
Temperature of the central region of the electrostatic chuck 18: 20° C.
Temperature of the edge region of the electrostatic chuck 18: 20° C.
Coolant temperature of the chiller unit 26: 10° C.
CPI: 36 steps
Distance between the upper electrode 34 and the mounting table 14: 35 mm
Processing time: 20 seconds
<Process S2>
Pressure within the processing vessel 12: 50 mTorr (6.66 Pa)
Frequency of a high frequency power of the high frequency power supply 44: 60 MHz
Power of the high frequency power of the high frequency power supply 44: 300 W
Frequency of a high frequency power of the high frequency power supply 20: 13 MHz
Power of the high frequency power of the high frequency power supply 20: 0 W
Voltage of the DC power supply 45: 900 V
Gas: $H_2$ gas (100 sccm) and Ar gas (800 sccm)
Gas split ratio into the buffer rooms 34c and 34d: 50:50
Temperature of the central region of the electrostatic chuck 18: 30° C.
Temperature of the edge region of the electrostatic chuck 18: 30° C.
Coolant temperature of the chiller unit 26: 10° C.
CPI: 36 steps
Distance between the upper electrode 34 and the mounting table 14: 35 mm
Processing time: 20 seconds
<Process S3>
Pressure within the processing vessel 12: 10 mTorr (1.33 Pa)
Frequency of a high frequency power of the high frequency power supply 44: 60 MHz
Power of the high frequency power of the high frequency power supply 44: 500 W
Frequency of a high frequency power of the high frequency power supply 20: 13 MHz
Power of the high frequency power of the high frequency power supply 20: 50 W
Etchant gas for the fourth layer HL4: $CF_4$ gas (150 sccm), $CHF_3$ gas (75 sccm), $O_2$ gas (5 sccm)
Etchant gas for the third layer HL3: $CF_4$ gas (150 sccm), $CHF_3$ gas (75 sccm), $O_2$ gas (5 sccm)
Etchant gas for the second layer HL2: $O_2$ gas (20 sccm), HBr gas (40 sccm), He gas (200 sccm)
Etchant gas for the first layer HL1: $Cl_2$ gas (30 sccm), Ar gas (200 sccm), $CH_4$ gas (10 sccm) Gas split ratio into the buffer rooms 34c and 34d: 50:50
Temperature of the center region of the electrostatic chuck 18: 30° C.
Temperature of the edge region of the electrostatic chuck 18: 30° C.
Coolant temperature of the chiller unit 26: 10° C.
CPI: 36 steps
Distance between the upper electrode 34 and the mounting table 14: 100 mm
Etching time of the fourth layer HL4: 20 seconds
Etching time of the third layer HL3: 20 seconds Etching time of the second layer HL2: 226 nm 100 seconds by using end point detection (EPD) Etching time of the first layer HL1: 30 seconds <Process S4>

Pressure within the processing vessel 12: 40 mTorr (5.33 Pa)

Frequency of a high frequency power of the high frequency power supply 44: 60 MHz Power of the high frequency power of the high frequency power supply 44: 100 W Frequency of a high frequency power of the high frequency power supply 20: 13 MHz Power of the high frequency power of the high frequency power supply 20: 200 W Voltage of the DC power supply 45 (applied only in the Experimental Example 11): 300 V Etchant gas: $CF_4$ gas (120 sccm), $CH_2F_2$ gas (12 sccm), $C_4F_8$ gas (3 sccm)

Gas split ratio into the buffer rooms 34c and 34d: 50:50

Temperature of the central region of the electrostatic chuck 18: 30° C.

Temperature of the edge region of the electrostatic chuck 18: 30° C.

Coolant temperature of the chiller unit 26: 10° C.

CPI: 36 steps

Distance between the upper electrode 34 and the mounting table 14: 40 mm

In each of the Experimental Examples 11 and 12, a SEM image of a cross section of the target object is captured after etching the etching target layer EL, and a difference between a CD value of a top portion of a line and a CD value of a bottom portion of the line, i.e., a CD bias is calculated. In addition, a thickness of a hard mask HM after etching the etching target layer EL, i.e., the hard mask HM formed from the first layer HL1 is measured. As a result, the CD bias in the Experimental Example 11 is found to be 5 nm, and the thickness of the hard mask HM in the Experimental Example 11 is found to be 24 nm. Meanwhile, the CD bias in the Experimental Example 12 is found to be 44 nm, and the thickness of the hard mask HM in the Experimental Example 12 is found to be 15 nm. Accordingly, it is confirmed from the Experimental Examples 11 and 12 that verticality in a height direction of the line pattern formed on the etching target layer EL can be increased by applying the negative DC voltage to the upper electrode 34 in the process S4. Further, it is also confirmed that the thickness of the hard mask HM maintained upon the completion of the etching of the etching target layer EL can be increased.

EXPERIMENTAL EXAMPLES 13 AND 14

In Experimental Example 13, the processes S1 and S2 are concurrently performed on a resist mask PRM of a target object W having a diameter of 300 mm, while setting a distance between the mounting table 14 and the upper electrode 34 to 130 mm. The resist mask PRM has a thickness of 80 nm. Further, the resist mask PRM has a line-and-space pattern with a line of a width of 55 nm and a space of a width of 55 nm on a dense region RD and a line-and-space pattern with a line of a width of 220 nm and a space of a width of 440 nm on a sparse region RI. Below are the other conditions for the Experimental Example 13 when carrying out the processes S1 and S2 at the same time.

Pressure within the processing vessel 12: 50 mTorr (6.66 Pa)

Frequency of a high frequency power of the high frequency power supply 44: 60 MHz Power of the high frequency power of the high frequency power supply 44: 300 W Frequency of a high frequency power of the high frequency power supply 20: 13 MHz Power of the high frequency power of the high frequency power supply 20: 0 W Voltage of the DC power supply 45: 1000 V $H_2$ gas flow rate: 100 sccm Ar gas flow rate: 800 sccm Gas split ratio into the buffer rooms 34c and 34d: 50:50

Temperature of the central region of the electrostatic chuck 18: 30° C.

Temperature of the edge region of the electrostatic chuck 18: 30° C.

Coolant temperature of the chiller unit 26: 10° C.

CPI: 36 steps

Processing time: 20 seconds

Further, in Experimental Example 14, a protective film is formed by a plasma CVD method after performing, with plasma of a $H_2$ gas, a curing process on a resist mask PRM of the same target object as the target object W used in the Experimental Example 13. Below are conditions for the plasma CVD method in the Experimental Example 14.

Pressure within the processing vessel: 10 mT

Frequency of a high frequency power for plasma generation: 60 MHz

Power of the high frequency power for plasma generation: 500 W

Power of a high frequency bias power: 0 W $SiCl_4$ gas flow rate: 25 sccm

He gas flow rate: 200 sccm $O_2$ gas flow rate: 5 sccm

Processing time: 5 seconds

Figure 23A:
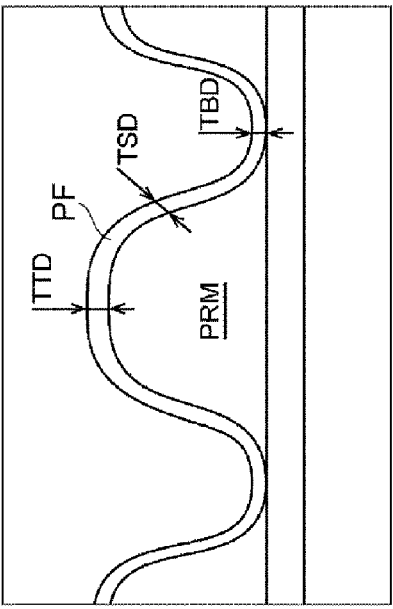
FIG. 23A to FIG. 23D are diagrams illustrating outlines of a resist mask PRM and a protective film PF on a TEM image of a target object W processed after conducting experimental examples 13 and 14.
Figure 23B:
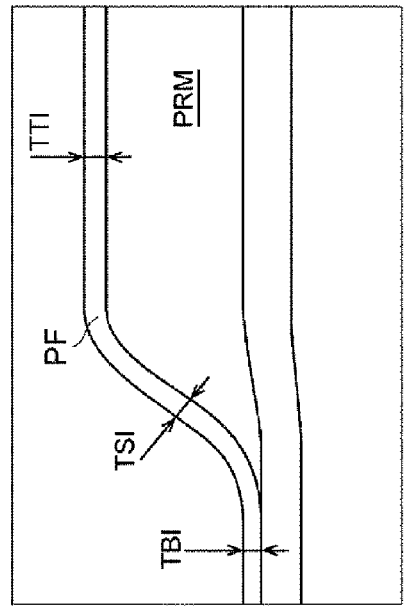
Figure 23C:
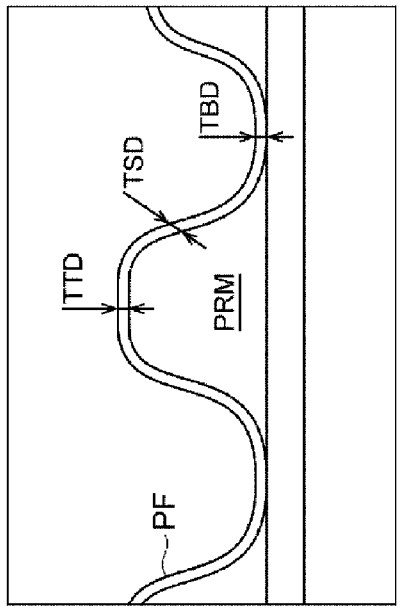
Figure 23D:
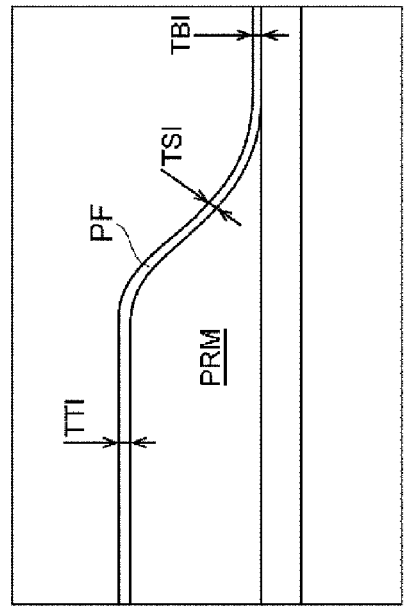

A TEM image of the target object W after the processes of the Experimental Examples 13 and 14 is obtained. FIG. 23A to FIG. 23D provide graphs showing outlines of the resist mask PRM and the protective film PF on the TEM image of the target object W after the processes of the Experimental Examples 13 and 14. FIG. 23A depicts the outline of the resist mask PRM and the protective film PF on the dense region RD of the target object W after the process of the Experimental Example 13, and FIG. 23B depicts the outline of the resist mask PRM and the protective film PF on the sparse region RI of the target object W after the process of the Experimental Example 13. In addition, FIG. 23C illustrates the outline of the resist mask PRM and the protective film PF on the dense region RD of the target object W after the process of the Experimental Example 14, and FIG. 23D illustrates the outline of the resist mask PRM and the protective film PF on the sparse region RI of the target object W after the process of the Experimental Example 14.

A thickness of the protective film PF is calculated from the TEM image of the target object W after the processes of the Experimental Examples 13 and 14. Specifically, a thickness TTD of the protective film PF formed on an upper surface US of the resist mask PRM on the dense region RD, a thickness TSD of the protective film PF formed on a side surface SS of the resist mask PRM on the dense region RD, a thickness TBD of the protective film PF formed on a bottom surface BS of a space SP on the dense region RD, a thickness TTI of the protective film PF formed on an upper surface US of the resist mask PRM on the sparse region RI, a thickness TSI of the protective film PF formed on a side surface SS of the resist mask PRM on the sparse region RI, and a thickness TBI of the protective film PF formed on a bottom surface BS of a space SP on the sparse region RI are calculated. Table 1 below shows the results.

TABLE 1

|  |  | Experimental Example 13 | Experimental Example 14 |
|---|---|---|---|
| Dense Region RD | TTD (nm) | 3.5 | 6.7 |
|  | TSD (nm) | 2.9 | 5.0 |
|  | TBD (nm) | 3.1 | 4.4 |
| Sparse Region RI | TTI (nm) | 3.5 | 6.5 |
|  | TSI (nm) | 3.1 | 6.4 |
|  | TBI (nm) | 3.2 | 4.8 |

As shown in Table 1, in the Experimental Example 14 through the plasma CVD method, there is found a significant difference between the thickness of the protective film PF formed on the resist mask PRM on the sparse region RI and the thickness of the protective film PF formed on the resist mask PRM on the dense region RD. Especially, in the Experimental Example 14, there is found a significant difference between the thickness TSD of the protective film PF formed on the side surface SS of the resist mask PRM on the dense region RD and the thickness TSI of the protective film PF formed on the side surface SS of the resist mask PRM on the sparse region RI. Meanwhile, as shown in Table 1, in the Experimental Example 13 through the PVD method, it is observed that the protective film PF having a uniform thickness is formed on the resist mask PRM on both the dense region RD and the sparse region RI.

EXPLANATION OF REFERENCE NUMERALS

10: Plasma processing apparatus
12: Processing vessel
12a: Sidewall
14: Mounting table
16: Base member (Lower electrode)
18: Electrostatic chuck
20: High frequency power supply (LF)
22: Power feed rod
24: Matching device
26: Chiller unit
28: DC power supply (for electrostatic chuck)
32: Heat transfer gas supply unit
34: Upper electrode
34a: Inner electrode portion
34a1: Electrode plate
34a2: Electrode supporting member
34b: Outer electrode portion
34b1: Electrode plate
34b2: Electrode supporting member
34c: First buffer room
34d: second buffer room
40: Power control circuit
40d: Variable capacitor
42: Matching device
44: High frequency power supply (HF)
45: DC power supply
52: Baffle plate
54: Bellows
66: Link
68: Screw shaft
70: Motor
72: Nut
FR: Focus ring
FS: Flow splitter
GS: Gas supply unit
GS1 to GS9: Gas sources
GM1 to GM9: Mass flow controllers
GV1 to GV9: Valves
HP: Heater power supply
HT (HT1, HT2): Heater
Cnt: Controller
W: Target object
PRM: Resist mask
HL: Hard mask layer
HL1: First layer (TiN layer)
HL2: Second layer (SOH layer)
HL3: Third layer (SiON layer)
HL4: Fourth layer (BARC)
HM: Hard mask
HM2 to HM4: masks
EL: Etching target layer

We claim:

1. A method of processing a target object, which has an etching target layer, a hard mask layer formed on the etching target layer and a resist mask formed on the hard mask layer, the method comprising:
exposing the resist mask to active species of hydrogen generated by exciting plasma of a hydrogen-containing gas within a processing vessel while the target object is mounted on a mounting table provided in the processing vessel; and
etching the hard mask layer by exciting plasma of an etchant gas within the processing vessel after the exposing of the resist mask to the active species of hydrogen,
wherein the plasma of the hydrogen-containing gas and the plasma of the etchant gas are excited by generating a high frequency electric field between an upper electrode and a lower electrode, which forms the mounting table and is provided to face the upper electrode, through an application of a high frequency power for plasma excitation to the upper electrode, and
a distance between the upper electrode and the mounting table in the etching of the hard mask layer is set to be larger than a distance between the upper electrode and the mounting table in the exposing of the resist mask to the active species of hydrogen,
wherein the distance between the upper electrode and the mounting table in the etching of the hard mask layer is set such that a Peclet number on a top surface of the mounting table is equal to or less than 1.

2. The method of claim 1, further comprising:
etching the etching target layer with a hard mask formed from the hard mask layer after the etching of the hard mask layer,
wherein the hard mask is made of TiN,
plasma of a fluorocarbon-based gas is generated within the processing vessel in the etching of the etching target layer, and
a distance between the upper electrode and the mounting table in the etching of the etching target layer is set to be shorter than the distance between the upper electrode and the mounting table in the etching of the hard mask layer.

3. The method of claim 1, further comprising:
applying a negative DC voltage to the upper electrode during the exposing of the resist mask to the active species of hydrogen, or between the exposing of the resist mask to the active species of hydrogen and the etching of the hard mask layer.

4. The method of claim 2,
wherein a negative DC voltage is applied to the upper electrode during the etching of the etching target layer.

5. The method of claim 3,
wherein the upper electrode contains silicon.

6. A method of processing a target object, the method comprising:
mounting the target object on which an etching target layer, a hard mask layer and a resist mask are formed on a mounting table facing an electrode provided in a processing vessel;
setting a distance between the electrode and the mounting table to a first distance;
supplying a hydrogen-containing gas into the processing vessel and generating plasma of the hydrogen-containing gas in a state where the distance between the electrode and the mounting table is set to the first distance;
exposing the resist mask to active species of hydrogen in the plasma of the hydrogen-containing gas;
setting a distance between the electrode and the mounting table to a second distance; and
supplying an etchant gas into the processing vessel to generate plasma of the etching gas, and etching the hard mask layer in a state where the distance between the electrode and the mounting table is set to the second distance or etching the etching target layer in a state where the distance between the electrode and the mounting table is set to a third distance,
wherein the second distance is larger than the first distance, and
the second distance is set such that a Peclet number on a top surface of the mounting table is equal to or less than 1.

7. The method of claim 6,
wherein the exposing of the resist mask in the state where the first distance is set is performed by applying a negative DC voltage to the electrode.

8. The method of claim 6,
wherein the etching of the hard mask layer in the state where the second distance is set or the etching of the etching target layer in the state where the third distance is set is performed by applying a negative DC voltage to the electrode.

9. The method of claim 6,
wherein the third distance is shorter than the second distance.

10. The method of claim 9,
wherein the third distance is the first distance.

* * * * *

UNITED STATES PATENT AND TRADEMARK OFFICE
CERTIFICATE OF CORRECTION

PATENT NO.        : 9,583,361 B2
APPLICATION NO.   : 14/427780
DATED             : February 28, 2017
INVENTOR(S)       : Yoshihide Kihara et al.

Page 1 of 1

It is certified that error appears in the above-identified patent and that said Letters Patent is hereby corrected as shown below:

In the Specification

Column 14, Line 34, replace "(r (second))" with -- ($\tau$ (second)) --.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*